United States Patent
Ikegami et al.

(10) Patent No.: US 8,805,907 B2
(45) Date of Patent: Aug. 12, 2014

(54) RANDOM NUMBER GENERATION DEVICE HAVING A RING OSCILLATOR

(75) Inventors: Kazutaka Ikegami, Fuchu (JP);
Shinichi Yasuda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1235 days.

(21) Appl. No.: 12/212,205

(22) Filed: Sep. 17, 2008

(65) Prior Publication Data

US 2009/0177725 A1 Jul. 9, 2009

(30) Foreign Application Priority Data

Jan. 8, 2008 (JP) .................. 2008-001141

(51) Int. Cl.
*G06F 7/58* (2006.01)
(52) U.S. Cl.
USPC .......................... 708/251; 708/250
(58) Field of Classification Search
None
See application file for complete search history.

(56) References Cited

U.S. PATENT DOCUMENTS

| | | | | |
|---|---|---|---|---|
| 3,984,703 A * | 10/1976 | Jorgensen | ..................... | 327/206 |
| 6,631,390 B1 * | 10/2003 | Epstein | ..................... | 708/250 |
| 7,111,029 B2 * | 9/2006 | Fujita et al. | ..................... | 708/250 |
| 2003/0214361 A1 | 11/2003 | Nishikido | | |
| 2004/0061538 A1 | 4/2004 | Yasuda et al. | | |
| 2005/0193045 A1 * | 9/2005 | Yamamoto et al. | ..................... | 708/250 |
| 2006/0244544 A1 | 11/2006 | Suzuki | | |
| 2008/0126458 A1 * | 5/2008 | Shin | ..................... | 708/255 |

FOREIGN PATENT DOCUMENTS

| | | |
|---|---|---|
| JP | 56-91531 | 7/1981 |
| JP | 2001-166920 | 6/2001 |
| JP | 2003-108365 | 4/2003 |
| JP | 2006-189946 | 7/2006 |
| JP | 2007-304730 | 11/2007 |

OTHER PUBLICATIONS

Tsai et al., "The Impact of Device Scaling on the Current Fluctuations in MOSFETs", Nov. 1994, IEEE Transactions on Electron Devices, vol. 41, No. 11.*
U.S. Appl. No. 12/050,079, filed Mar. 17, 2008.
Yu Cao, et al., "New Paradigm of Predictive MOSFET and Interconnect Modeling for Early Circuit Simulation", IEEE 2000 Custom Integrated Circuits Conference, 2000, pp. 201-204.
Predictive Technology Model, http://www.eas.asu.edu/~ptm/, 2007, 2 pages.

* cited by examiner

*Primary Examiner* — Lewis A Bullock, Jr.
*Assistant Examiner* — Christine Dang
(74) *Attorney, Agent, or Firm* — Oblon, Spivak, McClelland, Maier & Neustadt, L.L.P.

(57) ABSTRACT

It is made possible to provide a random number generation device which generates a physical random number with as little power dissipation as possible. A random number generation device includes: a ring oscillator having at least one set, each set comprising a current noise source and a Schmitt inverter configured to receive an output of the current noise source; and a conversion circuit configured to convert output frequency fluctuation of the ring oscillator to a random number and output the random number.

14 Claims, 22 Drawing Sheets

RANDOM NUMBER GENERATION DEVICE HAVING A RING OSCILLATOR

CROSS-REFERENCE TO RELATED APPLICATION

This application is based upon and claims the benefit of priority from prior Japanese Patent Application No. 2008-1141 filed on Jan. 8, 2008 in Japan, the entire contents of which are incorporated herein by reference.

BACKGROUND OF THE INVENTION

1. Field of the Invention

The present invention relates to a random number generation device which generates a random number on the basis of a physical phenomenon.

2. Related Art

As the information communication technique advances and spreads, demands for high quality random numbers are becoming strong. Strength of information security depends upon the random number which becomes the source of prediction difficulty. In the field of scientific technical calculation as well, high quality random numbers are needed for more accurate calculation.

A typically used random number is an arithmetic pseudo random number which is generated through a certain algorithm. A circuit for generating this random number can be fabricated simply. Though, if the initial value (seed) is constant, an output random number always becomes constant. In addition, there is a problem that the output random number has a constant repetition period determined by the circuit configuration.

On the other hand, there is a physical random number generated by utilizing a physical fluctuation phenomenon unlike the arithmetic random number. In the physical random number, the output random number does not depend upon the initial value and a random number series having no repetition period can be obtained, by utilizing the physical fluctuation. An example of a random number generation device which generates such a physical random number is disclosed in, for example, JP-A 2006-189946 (KOKAI).

In the random number generation device disclosed in JP-A 2006-189946 (KOKAI), a high quality random number can be generated by utilizing a noise source which generates noise intentionally made large. In the random number generation device, however, a comparator is used to make random numbers from the noise generated by noise source. There is a problem that the comparator consumes a large amount of power.

SUMMARY OF THE INVENTION

The present invention has been made in view of these circumstances, and an object thereof is to provide a random number generation device which generates a physical random number with as little power dissipation as possible.

A random number generation device according to an aspect of the present invention includes: a ring oscillator having at least one set, each set comprising a current noise source and a Schmitt inverter configured to receive an output of the current noise source; and a conversion circuit configured to convert frequency fluctuation of the ring oscillator to a random number and output the random number.

DETAILED DESCRIPTION OF THE INVENTION

Before the embodiments of the present invention are described, how we developed present invention will be described below.

Figure 2:
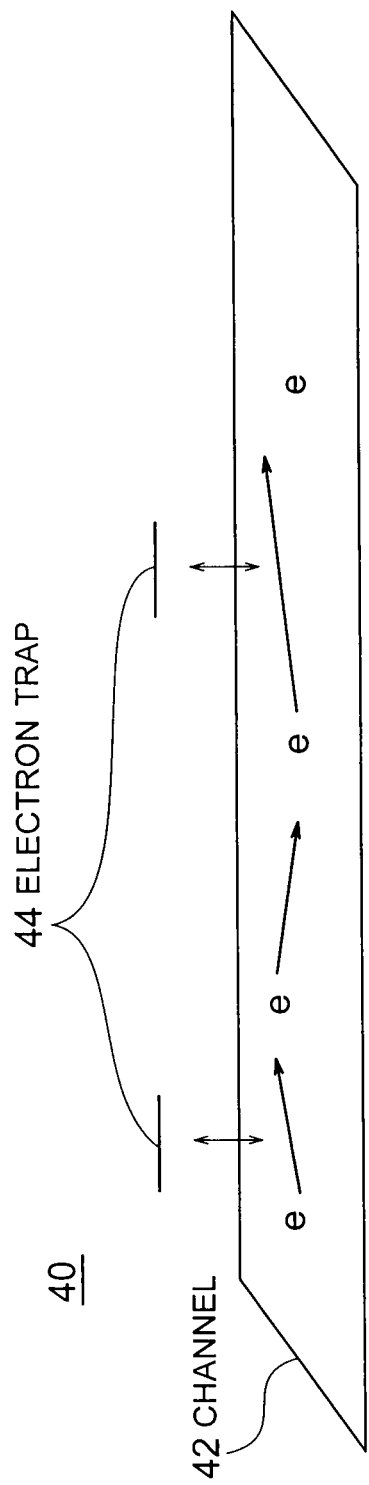
FIG. 2 is a schematic diagram for explaining a current noise source.

First, a current noise source used in a random number generation device according to an embodiment of the present invention will now be described. The current noise source means an element whose current value fluctuates large when constant voltages are applied to terminals of the element. For example, an element 40 includes a fine electron channel 42 of a nano-scale, and an electron trap 44 disposed near the electron channel 42 to generate a noise signal as shown in FIG. 2. As a specific example of the element 40, a field effect transistor (FET) having a fine channel length and a fine channel width can be mentioned.

In the FET, the electron channel 42 is a channel between a source region and a drain region of the FET, and the electron trap 44 is an electron trap in a gate insulation film of the FET. If an electron e is captured by the electron trap 44, then the electron e passing through the electron channel 42 is influenced by the Coulomb field formed by the electron e and the conductivity of the electron channel 42 changes. The capture or emission of the electron e in the electron trap 44 is conducted between the electron channel 42 and the electron trap 44 via an energy barrier which is present between the electron channel 42 and the electron trap 44. Since the capture or emission of the electron e occurs at random, the conductivity of the electron channel 42 fluctuates at random. Consequently, even if a constant voltage is supplied to the electron channel 42, a noise signal which fluctuates in current value at random can be generated in the electron channel. Such an element is disclosed in, for example, JP-A 2007-304730 (KOKAI). In the current noise source disclosed in JP-A 2007-304730 (KOKAI), noise is made large by contriving the structure of the MOSFET. A current noise source in which current noise is made large by contriving the structure or layout of the MOSFET is called MOSFET type current noise source.

Figure 3:
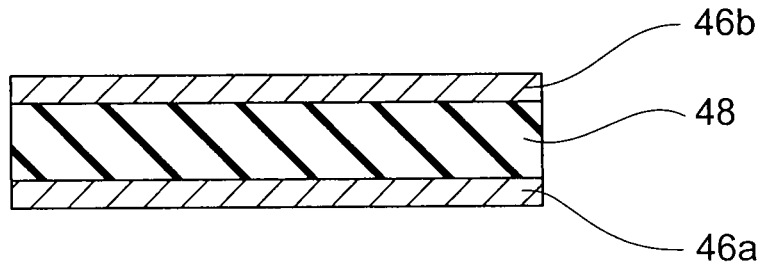
FIG. 3 is a cross-sectional view showing a resistance type current noise source.

As another example of the current noise source 40, a configuration having an insulation film 48 which is interposed between a pair of electrodes 46a and 46b as shown in FIG. 3 and which is softly breakdowned can also be used. This current noise source is, for example, a capacitor. If electrical stress is applied to the insulation film 48, the conductivity of the insulation film 48 slightly increases in the capacitor. If a constant voltage is applied to the insulation film 48 at this time, the electron e moves between electron traps in the insulation film 48 at random because of the tunnel phenomenon, and a largely fluctuating current value is obtained. A noise signal can be generated owing to the fluctuation in current value. The electrodes 46a and 46b are formed of a conductive material such as single crystal silicon, polycrystal silicon, amorphous silicon, or metal. The insulation film 48 is formed of an insulative material such as a single layer film like a silicon oxide film or a silicon nitride film, a high dielectric constant oxide (so-called high-k insulation film) containing hafnium or aluminum, or a composite film obtained by stacking them. The average conductivity of the softly breakdowned insulation film 48 between the electrodes 46a and 46b does not change by a voltage applied between the electrodes 46a and 46b. The current noise source in which the average conductivity does not depend upon the voltage between terminals is called resistance type current noise source.

Figure 4:
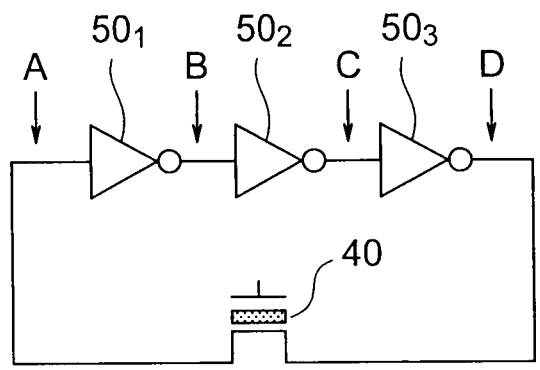
FIG. 4 shows a random number generation device obtained by incorporating a MOSFET type current noise source into a ring oscillator formed of three-stage inverters.
Figure 5:
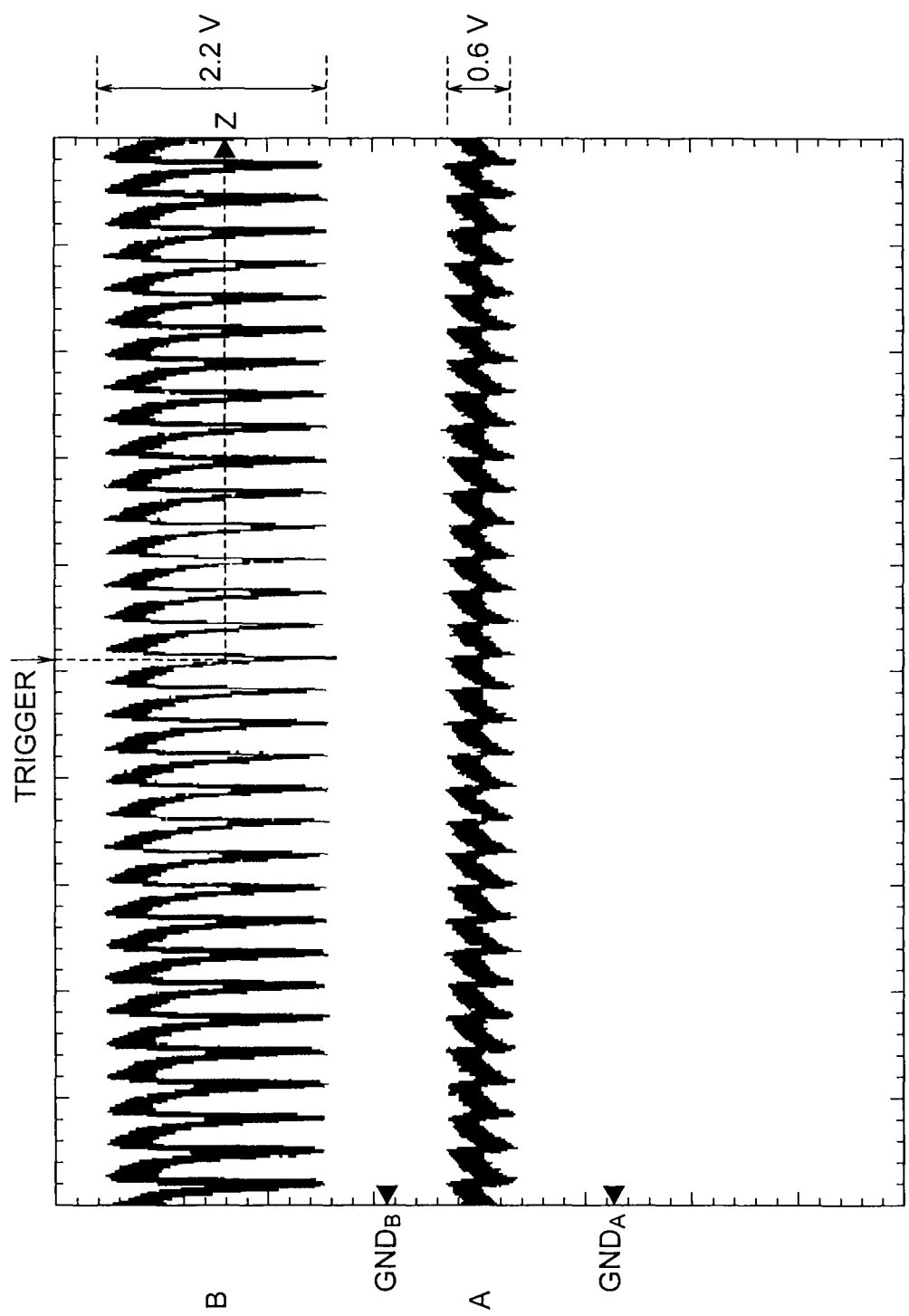
FIG. 5 is a waveform diagram showing characteristics of the random number generation device shown in FIG. 4.

The present inventors examined an oscillator obtained by incorporating a MOSFET type current noise source 40 into a route in a ring oscillator formed of three-stage inverters $50_1$, $50_2$ and $50_3$ shown in FIG. 4. FIG. 5 shows oscillation waveforms acquired at a point A and a point B in the oscillator by using an oscilloscope. The point A is a node between an output terminal of the current noise source 40 and an input terminal of the first stage inverter $50_1$. The point B is a node between an output terminal of the first stage inverter $50_1$ and an input terminal of the second stage inverter $50_2$. The oscillation waveforms at the point A and the point B are superposed and drawn by aligning timing at points where levels of ordinate axes of a plurality of waveforms measured at the point B pass through a point Z, i.e., aligning timing at a point represented as "trigger" on the abscissa axis. In FIG. 5, $GND_A$ represents a ground level for the point A, whereas $GND_B$ represents a ground level for the point B. If the oscillation period of the oscillator is constant, waveforms overlap well and consequently oscillation waveforms having no disorder are displayed on the screen of the oscilloscope. On the other hand, if there is fluctuation in the oscillation period of the oscillator, then the waveforms do not overlap and varied waveforms are displayed. The degree of variation in display on the oscilloscope screen becomes the indication of seeing the degree of fluctuation of the oscillation frequency.

As appreciated from FIG. 5, the oscillation waveforms overlap well and there is little fluctuation in the frequency. Comparing oscillation amplitudes at the points A and B with each other, the oscillation waveform at the point B has an amplitude of approximately 2.2 V whereas the oscillation waveform at the point A has an amplitude of approximately 0.6 V which is smaller than that at the point B. A small potential change at the point A means that charge movement at the point A is small. The reason why fluctuation is not found in the oscillation frequency of the oscillator is considered to be that the charge amount which flows through the current noise source 40 is small and consequently the effect of noise appearing in the oscillation waveform is small.

Figure 6:
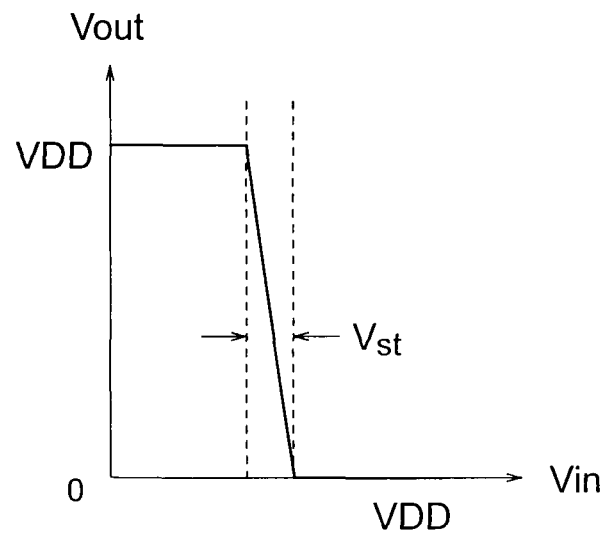
FIG. 6 is a diagram showing characteristics of a CMOS inverter.
Figure 7:
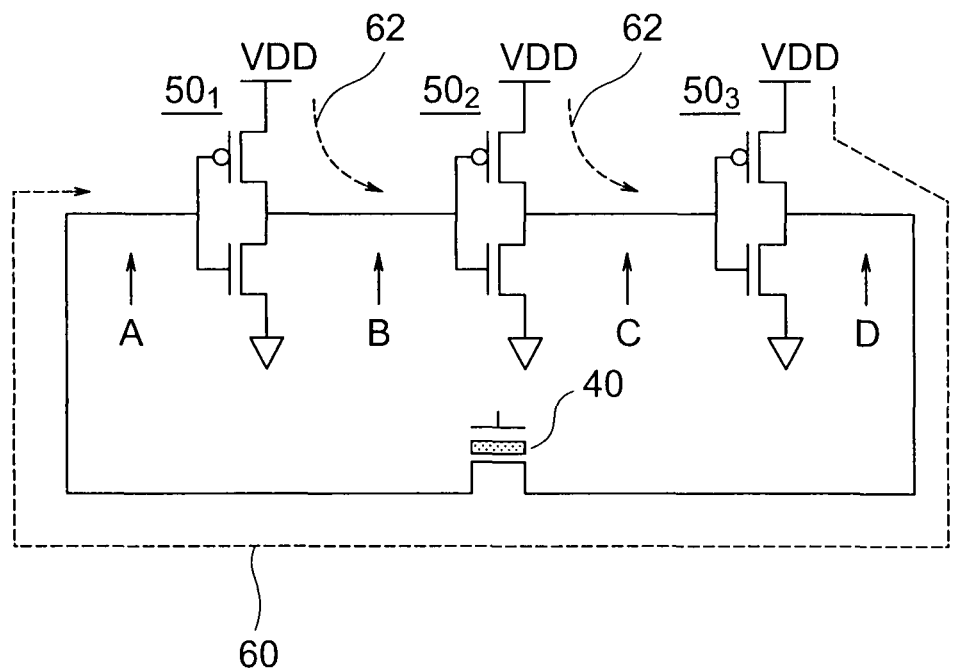
FIG. 7 is a diagram for explaining charging paths of gates of the inverters included in the random number generation device shown in FIG. 4.

The reason why the potential change at the point A located immediately after the output terminal of the current noise source 40 will now be described. Relations between an input voltage Vin and an output voltage Vout of an inverter are shown in FIG. 6. As represented by dashed lines in FIG. 6, a change of the input voltage required for the output of the inverter to be inverted is small. Paths for charging gates of the inverters $50_1$, $50_2$ and $50_3$ which constitute the ring oscillator shown in FIG. 4 are shown in FIG. 7. As represented by a dashed line 60, an input of the inverter $50_1$ is charged via a pMOSFET of the inverter $50_3$ and the current noise source 40. On the other hand, as represented by dashed lines 62, other inverters $50_2$ and $50_3$ are charged via only a pMOSFET of the inverter in the previous stage. In general, the conductivity of the current noise source 40 is lower than that of the MOSFET which forms the inverter $50_1$, $50_2$ or $50_3$. In other words, the gate capacitance of the inverter $50_1$ located immediately after the current noise source 40 is slower in charging speed than the gate capacitance of each of other inverters $50_2$ and $50_3$. A similar discussion holds true for the discharging speed of the inverters $50_1$, $50_2$ and $50_3$ as well. In FIG. 7, therefore, the potential change speed at the point A is slower than that at each of the point B, a point C and a point D. By the way, the point C is a node between an output terminal of the second stage inverter $50_2$ and an input terminal of the third stage inverter $50_3$, and the point D is a node between an output terminal of the third stage inverter $50_3$ and an input terminal of the current noise source 40.

Operation of the ring oscillator shown in FIG. 4 will now be described by taking the potential change at the point A as a start point. When the potential at the point A exceeds a threshold of the inverter $50_1$, the output of the inverter $50_1$ is inverted. And the inverted signal is conveyed successively as represented by κ→C→D. Concurrently with arrival of the inverted signal at the point D, the potential change direction at the point A is reversed. Since the potential change speed at the point A is slow, the potential at the point A does not change much from the threshold of the inverter $50_1$ when the inverted signal arrives at the point D. Since this operation is repeated, the oscillation amplitude at the point A becomes nearly equal to the input width required for the inverter output to make a transition (becomes nearly equal to the width $V_{st}$ between dashed lines shown in FIG. 6).

As appreciated from the foregoing description, the reason why the fluctuation of the oscillation frequency of the ring oscillator shown in FIG. 4 is small is that the potential change speed at the point A is slow and the input voltage change required for the inverter $50_1$ to invert is small and consequently charges do not flow through the current noise source 40 so much.

Therefore, the present inventors have considered that the inverter to which the output of the current noise source is input needs only to be an inverter which is not inverted until charges are let flow to some degree. In other words, the present inventors have considered it is desirable to use an inverter which utilize Schmitt trigger technique since it has hysteresis in its input-output relations. Hereafter, such an inverter is referred to as Schmitt inverter.

Embodiment

Figure 1:
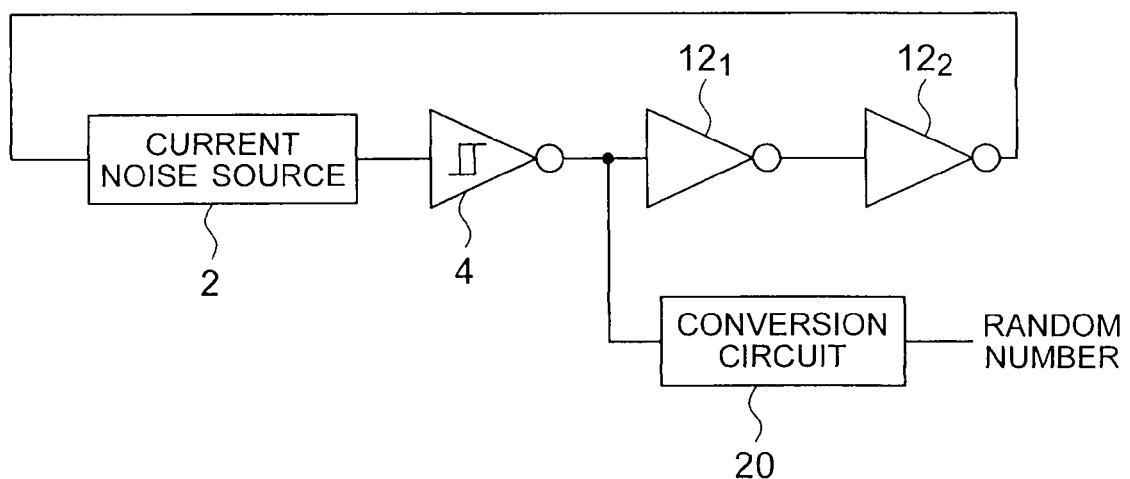
FIG. 1 is a block diagram showing a random number generation device according to a first embodiment.

A random number generation device according to an embodiment of the present invention will now be described. The random number generation device according to the present embodiment is shown in FIG. 1. The random number generation device according to the present embodiment includes a current noise source 2, a Schmitt inverter 4, inverters $12_1$ and $12_2$, and a conversion circuit 20. The current noise source 2 may be either of a MOSFET type current noise source and a resistance type current noise source. The Schmitt inverter 4 receives an output of the current noise source 2. The inverter $12_1$ receives an output of the Schmitt inverter 4, and the inverter $12_2$ receives an output of the inverter $12_1$. And an output of the inverter $12_2$ is input to the current noise source 2. In other words, the current noise source 2, the Schmitt inverter 4, and the inverters $12_1$ and $12_2$ constitute a ring oscillator. In this ring oscillator, the Schmitt inverter 4 lets charges flow through the current noise source 2 efficiently, and consequently the influence of noise is effectively exerted to the oscillation signal of the ring oscillator. Accordingly, the frequency of the ring oscillator fluctuates largely. The conversion circuit 20 generates a random number by utilizing fluctuation in the oscillation frequency of the ring oscillator.

The action and effect of the random number generation device according to the present embodiment having the above-described configuration will now be described.

Figure 9:
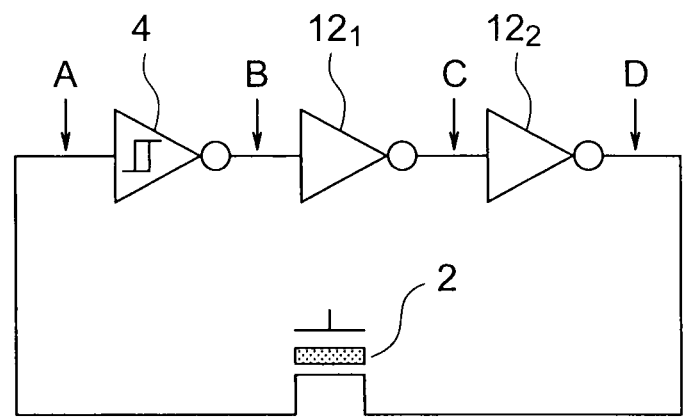
FIG. 9 is a circuit diagram using a MOSFET type current noise source as a current noise source in the random number generation device shown in FIG. 1.
Figure 10:
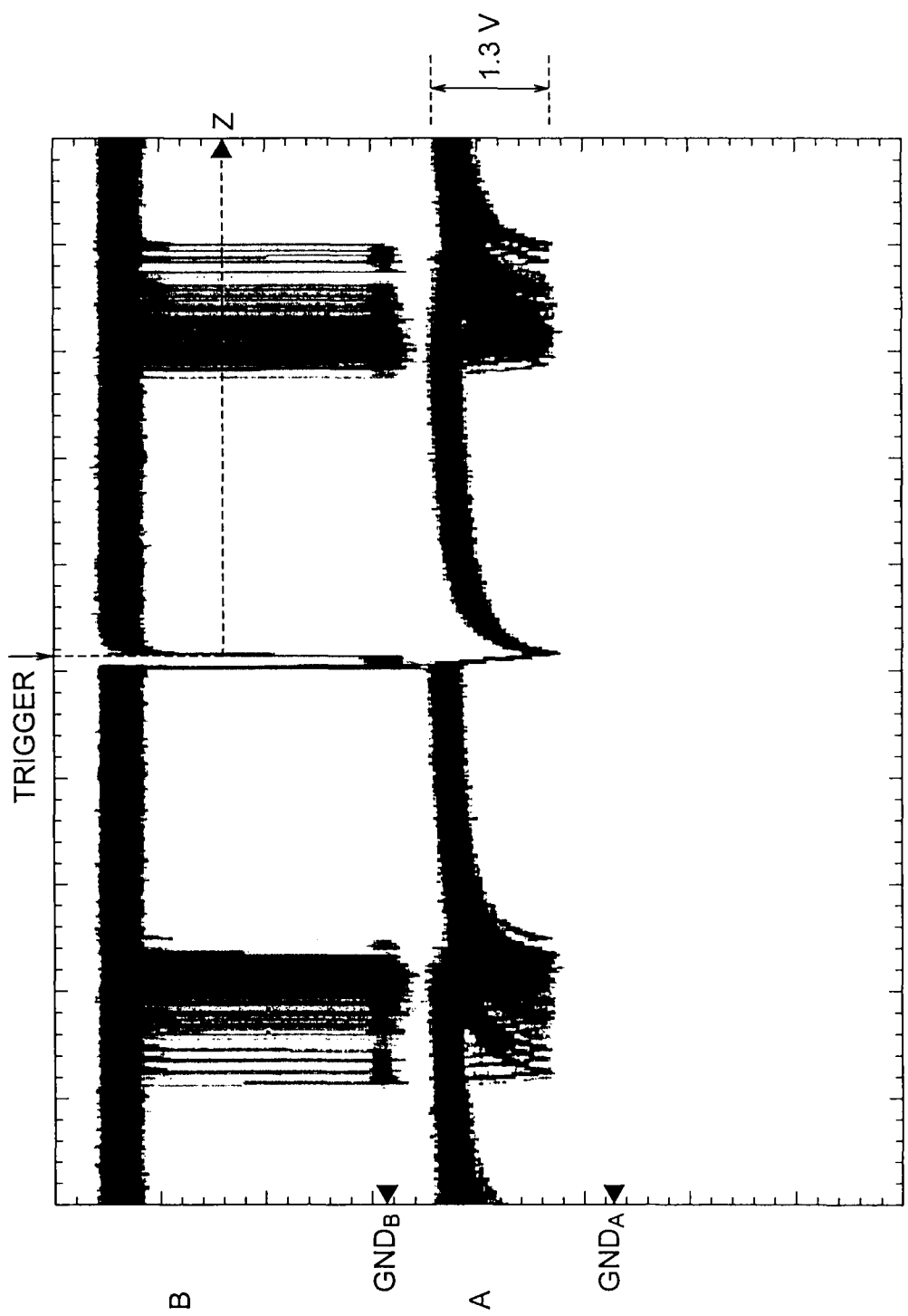
FIG. 10 is a waveform diagram showing characteristics of the random number generation device shown in FIG. 9.

A ring oscillator used in the random number generation device according to the present embodiment is shown in FIG. 9. An oscillation waveform at a point A and an oscillation waveform at a point B in the ring oscillator acquired by using an oscilloscope are shown in FIG. 10. The point A is a node between an output terminal of the current noise source 2 and an input terminal of the Schmitt inverter 4. The point B is a node between an output terminal of the Schmitt inverter 4 and an input terminal of the inverter $12_1$. In FIG. 10, a plurality of waveforms are superposed and drawn by aligning timing at a point represented as "trigger" in the same way as the case shown in FIG. 5. Furthermore, the time scale is aligned with that in FIG. 5. It is appreciated from FIG. 10 that the waveform is disturbed on the left and right of the trigger. This is because the oscillation waveforms superposed and drawn do not overlap each other. In other words, it is indicated that oscillation period is fluctuating. The potential amplitude at the point A is approximately 1.3 V and it is appreciated that the potential amplitude value has become large as compared with the case shown in FIG. 5. The fact that the potential amplitude has become large means that charges flowing through the current noise source 2 have increased by that amount. It is considered that the fluctuation of the oscillation frequency has increased because a larger amount of charge can be let flow through the current noise source 2.

Operation of the ring oscillator will now be described by taking the point A shown in FIG. 9 as a start point. If the potential at the point A exceeds a potential $V_H$ shown in FIG. 8, the Schmitt inverter 4 is inverted and its signal is conveyed as represented by κ→C→D. The point C is a node between an output terminal of the inverter $12_1$ and an input terminal of the inverter $12_2$. The point D is a node between an output terminal of the inverter $12_2$ and an input terminal of the current noise source 2. If the inversion signal is conveyed to the point D, the potential at the point A begins to decrease. Although the potential change speed at the point A is slow, the Schmitt inverter 4 is not inverted until the potential at the point A becomes lower than $V_L$ shown in FIG. 8. Since current flows through the current noise source 2 during that time period, the oscillation waveform is subjected to influence of noise. If the potential at the point A becomes lower than $V_L$, the Schmitt inverter 4 is inverted and its signal is conveyed as represented by B→C→D. If the inversion signal is conveyed to the point D, the potential at the point A begins to increase. Although the potential change speed at the point A is slow, the Schmitt inverter 4 is not inverted until the potential at the point A reaches $V_H$. A current flows through the current noise source 2 during that time period. The ring oscillator shown in FIG. 9 oscillates by repeating this operation.

If the output of the current noise source is input to an ordinary inverter as already described with reference to FIG. 4, then the potential at the point A changes by only approximately the transition width of the inverter.

On the other hand, if the output of the current noise source 2 is input to the Schmitt inverter 4, then it becomes possible for the potential at the point A to change by approximately a threshold voltage difference ($=V_H-V_L$) of the Schmitt inverter. Since the potential change at the point A increases, it becomes possible to let more charges flow and the fluctuation of the oscillation frequency of the ring oscillator can be made large. Since the operation heretofore described is implemented, the oscillation frequency of the ring oscillator shown in FIG. 9 has large fluctuation shown in FIG. 10.

Figure 11:
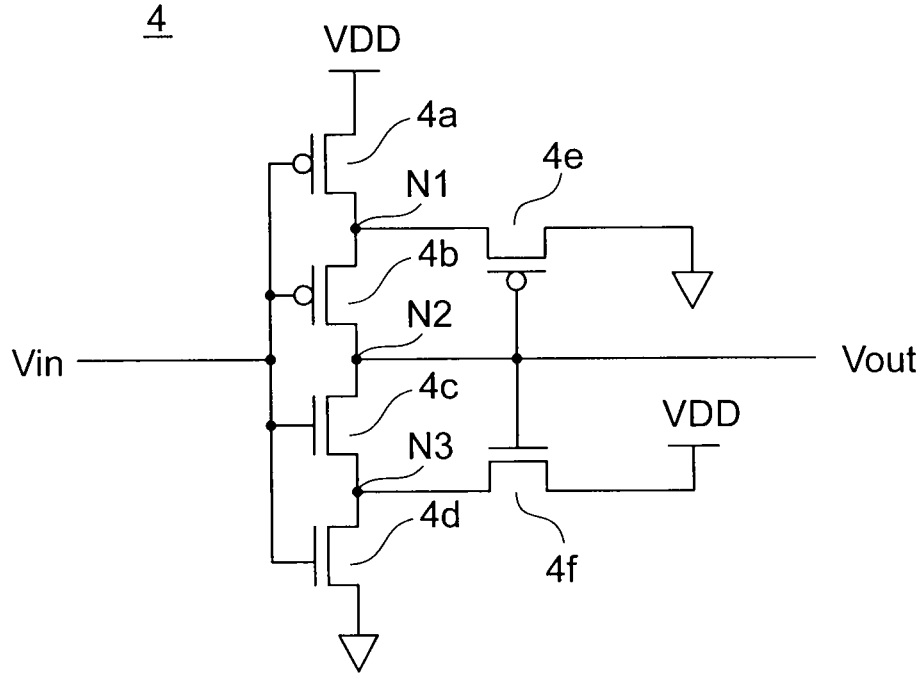
FIG. 11 is a circuit diagram showing a specific example of a Schmitt inverter used in the embodiment shown in FIG. 1.

A specific example of the Schmitt inverter 4 will now be described with reference to FIG. 11. The Schmitt inverter 4 in this specific example includes p-channel MOSFETs 4a and 4b connected in series, n-channel MOSFETs 4c and 4d connected in series, a p-channel MOSFET 4e, and an n-channel MOSFET 4f. Gates of the p-channel MOSFETs 4a and 4b and the n-channel MOSFETs 4c and 4d are connected in common and supplied with an input voltage Vin. A power supply voltage VDD is applied to the p-channel MOSFET 4a at its source. The p-channel MOSFET 4a is connected at its drain to the p-channel MOSFET 4b at its source via a connection node N1. Drains of the p-channel MOSFET 4b and the n-channel MOSFET 4c are connected in common at a connection node N2. The n-channel MOSFET 4c is connected at its source to the n-channel MOSFET 4d at its drain via a connection node N3.

The n-channel MOSFET 4d is connected at its source to the ground. The p-channel MOSFET 4e is connected at its source to the connection node N1, connected at its drain to the ground, and connected at its gate to the connection node N2. The n-channel MOSFET 4f is connected at its source to the connection node N3, and the power supply voltage VDD is applied to the n-channel MOSFET 4f at its drain, and connected at its gate to the connection node N2. An output Vout is output from the connection node N2.

Operation of the Schmitt inverter 4 in the present specific example having the above-described configuration will now be described with reference to FIG. 8 and FIG. 11. When potential at an input Vin is "0", the p-channel MOSFETs 4a and 4b are the ON state and the n-channel MOSFETs 4c and 4d are the OFF state. As a result, the potential at the node N2 becomes VDD. In other words, the output Vout becomes VDD. Since the p-channel MOSFET 4e is in the OFF state at this time, the potential at the node N1 is VDD. Since the n-channel MOSFET 4f driven to the saturation region is present between the node N3 and VDD, the potential at the node N3 becomes "VDD–$Vth_{4f}$." Here, $Vth_{4f}$ is a threshold voltage of the n-channel MOSFET 4f.

If in this state the potential at the input Vin increases gradually from "0" and approaches a potential (usually, VDD/2) at which the output of an ordinary inverter formed of one p-channel MOSFET and one n-channel MOSFET connected in series is inverted, then the n-channel MOSFET 4d begins to turn on gradually. Since the n-channel MOSFET 4f is in the ON state, however, the potential at the node N3 does not become "0" although it decreases from "VDD–$Vth_{4f}$." Therefore, the potential difference between the gate and source of the n-channel MOSFET 4c is smaller than the threshold voltage of the n-channel MOSFET 4c. As a result, the n-channel MOSFET 4c is in the OFF state, and Vout remains VDD (see FIG. 8).

Further, the potential at the input Vin increases. Immediately before the potential at the input Vin reaches a predetermined potential, i.e., a first threshold $V_H$ (see FIG. 8), the n-channel MOSFET 4c begins to turn on and the output Vout begins to decrease.

Figure 8:
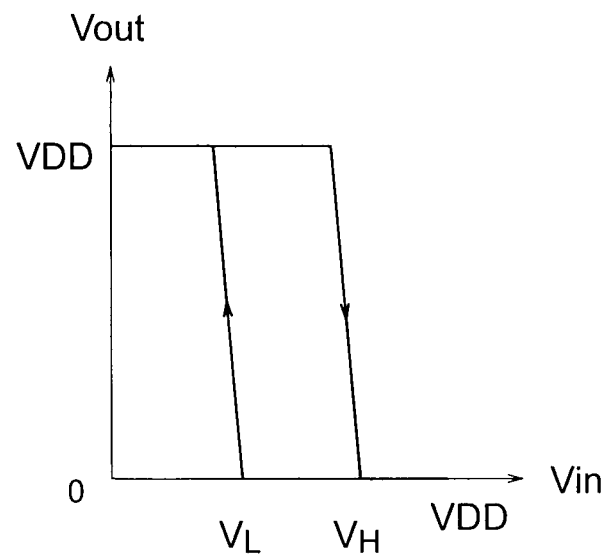
FIG. 8 is a diagram showing characteristics of a Schmitt inverter.

If the potential at the input Vin further increases and exceeds the first threshold $V_H$, then the p-channel MOSFET 4b becomes the OFF state and the n-channel MOSFET 4c becomes the ON state, and the output Vout becomes "0" (see FIG. 8). Even if Vin is further raised, the output Vout remains "0."

When the potential at the input Vin is "VDD," the p-channel MOSFETs 4a and 4b are the OFF state and the n-channel MOSFETs 4c and 4d are the ON state. Therefore, the potential at the node N2 becomes "0." In other words, the output Vout becomes "0." Since the n-channel MOSFET 4f is in the OFF state at this time, the potential at the node N3 is "0." Since the p-channel MOSFET 4e driven to the saturation region is present between the node N1 and VDD, the potential at the node N1 becomes "$Vth_{4e}$." Here, $Vth_{4e}$ is an absolute value of the threshold voltage of the p-channel MOSFET 4e.

If in this state the potential at the input Vin decreases gradually from VDD and approaches a potential (usually, VDD/2) at which the output of an ordinary inverter formed of one p-channel MOSFET and one n-channel MOSFET connected in series is inverted, then the p-channel MOSFET 4a begins to turn on gradually. Since the p-channel MOSFET 4e is in the ON state, however, the potential at the node N1 does not become "VDD" although it increases from "$Vth_{4e}$." Therefore, the potential difference between the gate and source of the p-channel MOSFET 4b is smaller than the threshold voltage. As a result, the p-channel MOSFET 4b is in the OFF state, and Vout remains "0" (see FIG. 8).

Further, the potential at the input Vin decreases. Immediately before the potential at the input Vin reaches a predetermined potential, i.e., a second threshold $V_L$ (see FIG. 8), the p-channel MOSFET 4b begins to turn on and the output Vout begins to increase.

If the potential at the input Vin further decreases and becomes lower than the first threshold $V_L$, then the n-channel MOSFET 4c becomes the OFF state and the p-channel MOSFET 4b becomes the ON state, and the output Vout becomes "VDD" (see FIG. 8). Even if Vin is further raised, the output Vout remains "VDD."

Conditions concerning the first and second threshold voltages of the Schmitt inverter 4 will now be described.

Desirable relations of the first and second thresholds $V_H$ and $V_L$ of the Schmitt inverter 4 will now be described. It is now supposed that the input potential of the Schmitt inverter 4 is V, the conductivity of the current noise source is σ, the input gate capacitance of the Schmitt inverter 4 is C and the power supply voltage is VDD. For brevity, the conductivity of MOSFETs which constitute the inverter $12_2$ is so large as compared with that of the current noise source 2 that it is neglected. It is supposed that the input potential of the Schmitt inverter 4 begins to increase at time t=0. At this time, relations between a current i which flows into the gate and V satisfy the following equation (1).

$$i = \sigma(VDD - V) \tag{1}$$

Denoting charge stored in the input gate of the Schmitt inverter 4 by Q, it follows that Q=C×V and consequently the following equation is obtained.

$$\frac{dV}{dt} = \frac{1}{C}\frac{dQ}{dt} = \frac{1}{C}i \tag{2}$$

From the equations (1) and (2), the following equation is obtained.

$$\frac{dV}{dt} = \frac{\sigma}{C}(VDD - V) \tag{3}$$

It is supposed that the conductivity of the current noise source 2 does not depend upon voltages applied to terminals. Solving the differential equation (3) under the initial condition V=$V_L$ at t=0, the voltage V is represented by the following equation (4).

$$V = VDD - (VDD - V_L)\exp\left(-\frac{\sigma}{C}t\right) \tag{4}$$

Supposing that V=$V_H$ at t=t1, the following equation is obtained.

$$t1 = \frac{C}{\sigma}\ln\left(\frac{VDD - V_L}{VDD - V_H}\right) \tag{5}$$

This is a delay time required for the output of the Schmitt inverter 4 to be inverted since the inverter (in FIG. 1, which is the inverter $12_2$) disposed in a stage preceding the Schmitt inverter 4 is inverted. In the case where the conductivity σ fluctuates by Δσ, fluctuation Δt1 of the delay time is represented as follows:

$$t1 + \Delta t1 = \frac{C}{\sigma + \Delta\sigma}\ln\left(\frac{VDD - V_L}{VDD - V_H}\right) \approx \frac{C}{\sigma}\left(1 - \frac{\Delta\sigma}{\sigma}\right)\ln\left(\frac{VDD - V_L}{VDD - V_H}\right) \quad (6)$$

$$\Delta t1 = -\frac{C}{\sigma}\left(\frac{\Delta\sigma}{\sigma}\right)\ln\left(\frac{VDD - V_L}{VDD - V_H}\right) \quad (7)$$

Denoting the accumulation of gate delays of parts obtained by excluding the Schmitt inverter 4 from the ring oscillator by T, the average oscillation period is T+t1. When generating a high quality random number, it is desirable that the fluctuation Δt1 of the oscillation period is at least 1% of the oscillation period T+t1. In other words, it is desirable that the following equation (8) is satisfied.

$$\frac{\Delta t1}{T + t1} = \frac{\frac{C}{\sigma}\left(\frac{\Delta\sigma}{\sigma}\right)\ln\left(\frac{VDD - V_L}{VDD - V_H}\right)}{T + \frac{C}{\sigma}\ln\left(\frac{VDD - V_L}{VDD - V_H}\right)} \geq 0.01 \quad (8)$$

This is a desirable relation concerning the first and second thresholds $V_H$ and $V_L$ of the Schmitt inverter 4. In the case where the conductivity depends upon voltages applied to terminals, the equation (8) is applied by using the average conductivity.

In the case where an nMOSFET type current noise source is used as the current noise source 2 in the present embodiment, it is necessary that a voltage VG applied to the gate of the n-channel MOSFET type current noise source satisfies the following relation.

$VG > V_H + Vth$

Here, $V_H$ is a larger threshold (first threshold) of the Schmitt inverter 4, and Vth is a threshold voltage of the n-channel MOSFET type current noise source. If the relation is not satisfied and the potential at the point A shown in FIG. 9 gradually increases, then the relation $V_{GS}$=Vth is satisfied at a certain time point. If so, then the n-channel MOSFET type current noise source turns off and consequently it becomes impossible for charges to flow to the point A and oscillation stops.

In the case where a p-channel MOSFET type current noise source is used as the current noise source in the present embodiment, a voltage VG applied to the gate of the p-channel MOSFET type current noise source needs to satisfy the following relation.

$VG < V_L - VTH$

Here, $V_L$ is a smaller threshold (second threshold) of the Schmitt inverter 4, and VTH is an absolute value of the threshold voltage of the p-channel MOSFET type current noise source. If the relation is not satisfied and the potential at the point A shown in FIG. 9 gradually decreases, then the relation $V_{GS}$=VTH is satisfied at a certain time point. If so, then the p-channel MOSFET type current noise source turns off and consequently it becomes impossible for charges to flow to the point A and oscillation stops.

Figure 12:
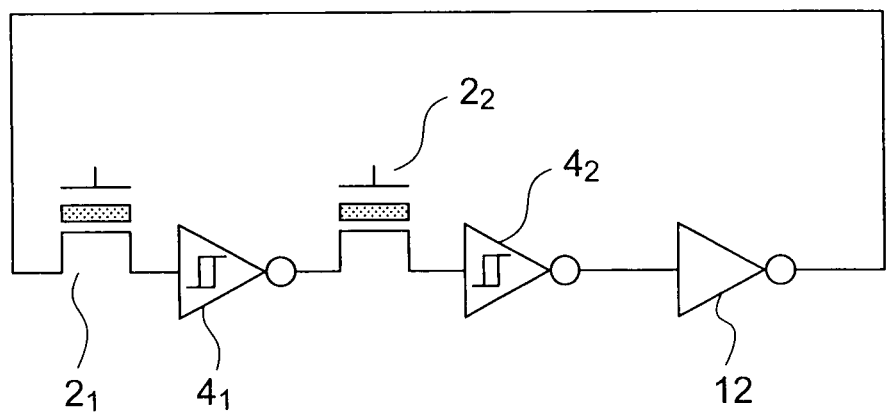
FIG. 12 is a circuit diagram showing a ring oscillator according to a first modification.

In the present embodiment, one set including a current noise source and a Schmitt inverter is included in the ring oscillator. However, the ring oscillator may include a plurality of sets. For example, the ring oscillator may include a plural-ity of sets (in FIG. 12, two sets) each including a current noise source and a Schmitt inverter, and at least one ordinary inverter as shown in FIG. 12. In other words, the ring oscillator shown in FIG. 12 may have a configuration obtained by serially connecting a set including a MOSFET type current noise source $2_1$ and a Schmitt inverter $4_1$ connected in series, a set including a MOSFET type current noise source $2_2$ and a Schmitt inverter $4_2$ connected in series, and an ordinary inverter 12. In this case, it is necessary that the total number of Schmitt inverters and ordinary inverters is odd. Otherwise, oscillation is not caused.

Figure 13:
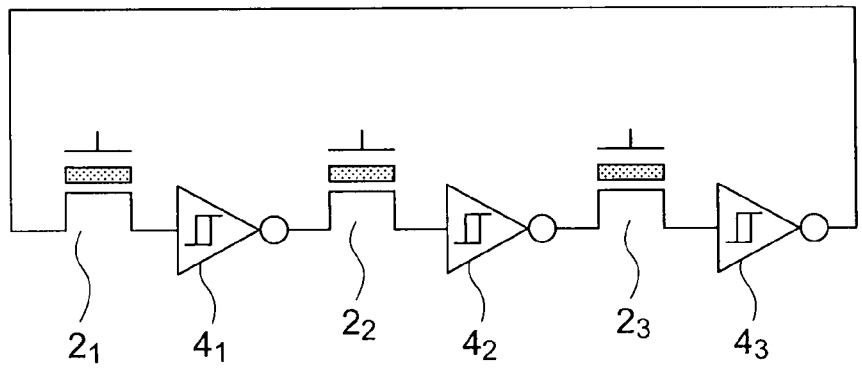
FIG. 13 is a circuit diagram showing a ring oscillator according to a second modification.

As shown in FIG. 13, the ring oscillator may have a configuration of a series circuit obtained by serially connecting an odd number of at least three sets (in FIG. 13, three sets) each including a current noise source and a Schmitt inverter. In other words, the ring oscillator shown in FIG. 13 may have a configuration obtained by serially connecting a set including a MOSFET type current noise source $2_1$ and a Schmitt inverter $4_1$ connected in series, a set including a MOSFET type current noise source $2_2$ and a Schmitt inverter $4_2$ connected in series, and a set including a MOSFET type current noise source $2_3$ and a Schmitt inverter $4_3$ connected in series. In this case, an ordinary inverter is not needed.

Figure 14:
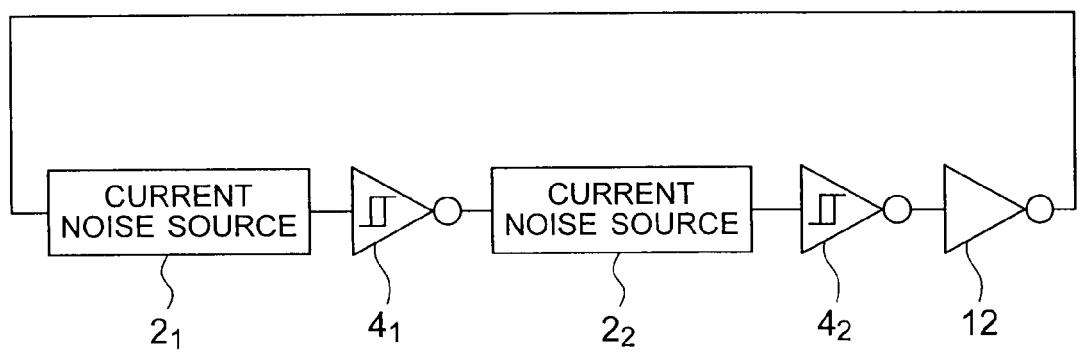
FIG. 14 is a circuit diagram showing a ring oscillator according to a third modification.

As shown in FIG. 14, the ring oscillator may include a plurality of sets each including a current noise source and a Schmitt inverter, and current noise sources of different kinds may be used as current noise sources of the sets. In other words, a ring oscillator shown in FIG. 14 includes a serial connection of a set including a current noise source $2_1$ and a Schmitt inverter $4_1$, a set including a current noise source $2_2$ and a Schmitt inverter $4_2$, and an ordinary inverter 12. For example, a MOSFET type current source may be used as the current noise source $2_1$ and, for example, a resistance type current source may be used as the current noise source $2_2$.

Figure 15:
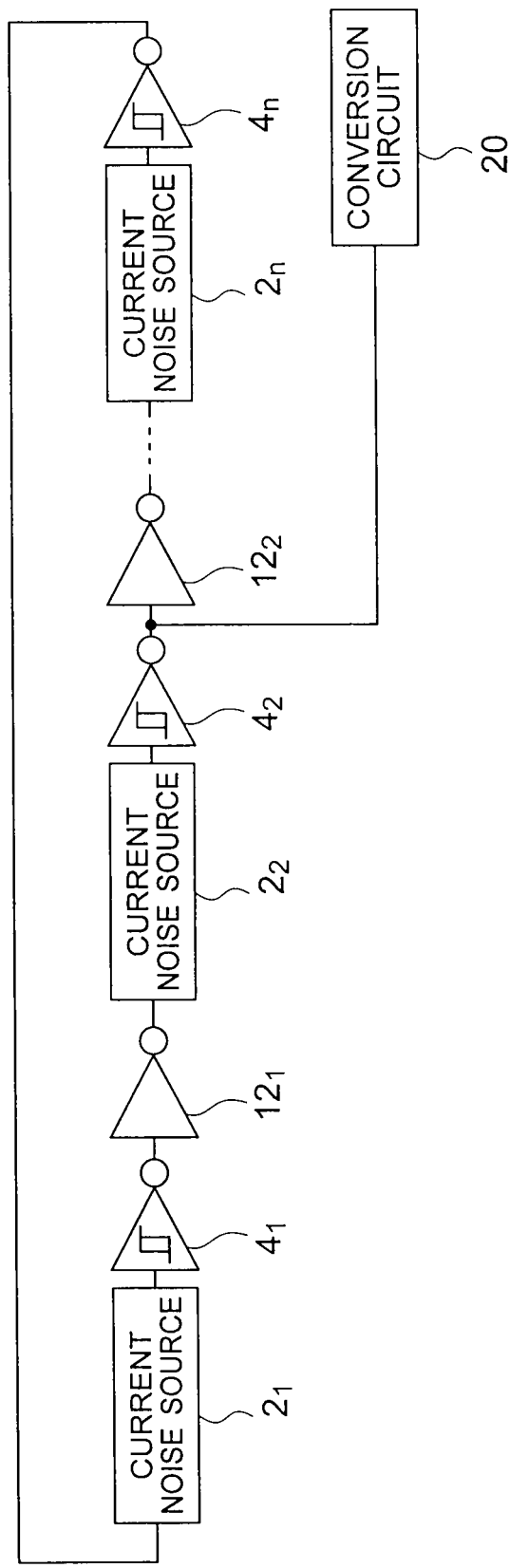
FIG. 15 is a circuit diagram showing a random number generation device having a ring oscillator according to a fourth modification.
Figure 27:
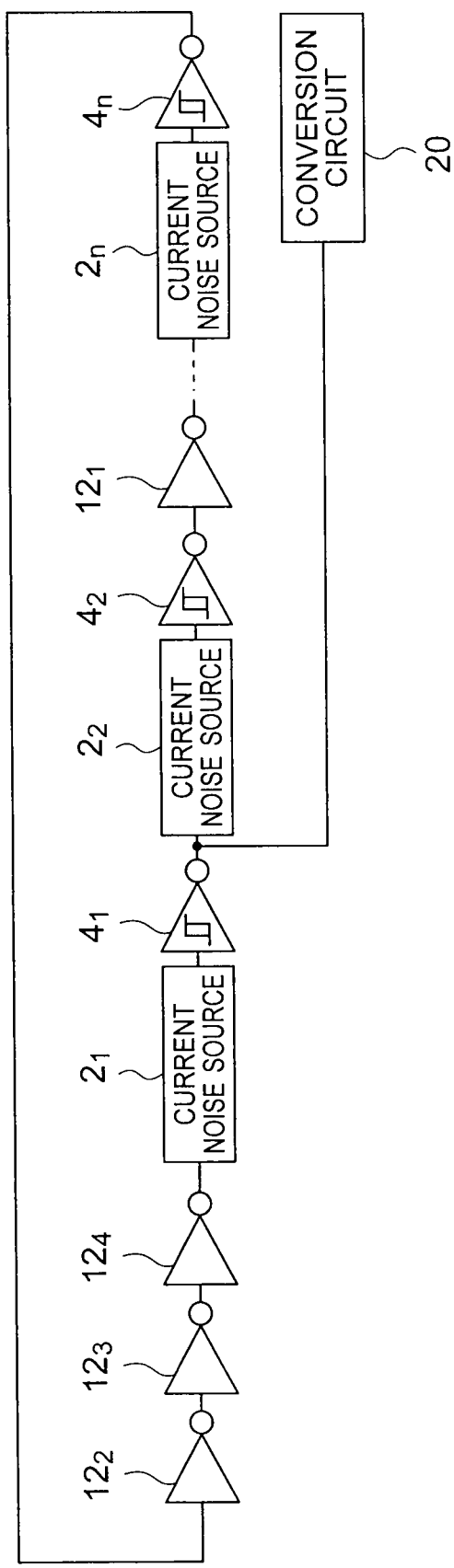
FIG. 27 is a circuit diagram showing a specific example of a ring oscillator.
Figure 28:
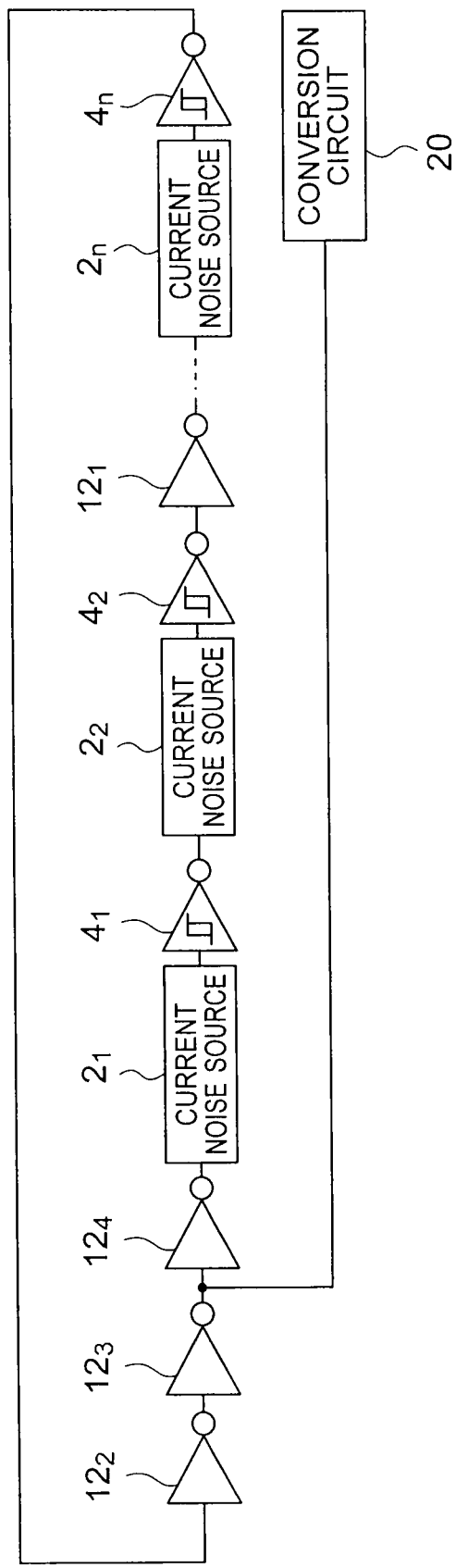
FIG. 28 is a circuit diagram for explaining a location of an output of the ring oscillator.

As shown in FIG. 15, the ring oscillator may be formed by serially connecting a series circuit obtained by serially connecting (n−1) sets (where n is an integer of at least 3) each including a current noise source, a Schmitt inverter and an ordinary inverter connected in series, and one set of a series circuit including a current noise source and a Schmitt inverter. In other words, the ring oscillator may have a configuration obtained by serially connecting a current noise source $2_1$, a Schmitt inverter $4_1$, an inverter $12_1$, a current noise source $2_2$, a Schmitt inverter $4_2$, an inverter $12_2$, . . . , a current noise source $2_n$, and a Schmitt inverter $4_n$. As shown in FIG. 27, the ring oscillator may have a configuration obtained by serially connecting n (where n≥1) series circuits each including a current noise source $2_i$ (i=1, . . . , n) and a Schmitt inverter $4_i$ and providing a plurality of (in FIG. 27, four) inverters $12_1$ to $12_4$ between them. The inverters can be provided in arbitrary locations. As for the number of the inverters provided in the ring oscillator, there is no limit as long as the sum of the number of the inverters and the number of Schmitt inverters included in the ring oscillator is an odd number. It is not necessary to take out the output of the ring oscillator from an output of a Schmitt inverter. For example, although the output of the ring oscillator is taken out from an output terminal of the Schmitt inverter $4_1$ in FIG. 27, the output of the ring oscillator may be taken out from an output terminal of the inverter $12_3$ as shown in FIG. 28. By the way, the ring oscillator shown in FIG. 28 has the same configuration as that of the ring oscillator shown in FIG. 27.

Thus providing the ring oscillator with a plurality of sets each including a current noise source and a Schmitt inverter brings about an effect of making the fluctuation of the oscillation frequency large as compared with a ring oscillator having one set.

In the foregoing description, an inverter using the Schmitt trigger technique has been used as a Schmitt inverter. A buffer using the Schmitt trigger technique which operates in the same way as the Schmitt inverter may be used instead of the Schmitt inverter. As a matter of course, it is necessary to conduct design as to the number of coupled inverters and buffers so as to cause operation as the ring oscillator.

Duty ratio of the ring oscillator will now be described.

It is appreciated from the oscillation waveform shown in FIG. 10 that the duty ratio is not 50%. Especially when a MOSFET type current noise source is used, the duty ratio does not become 50% in some cases according to the circuit configuration. The reason will now be described.

Figure 16:
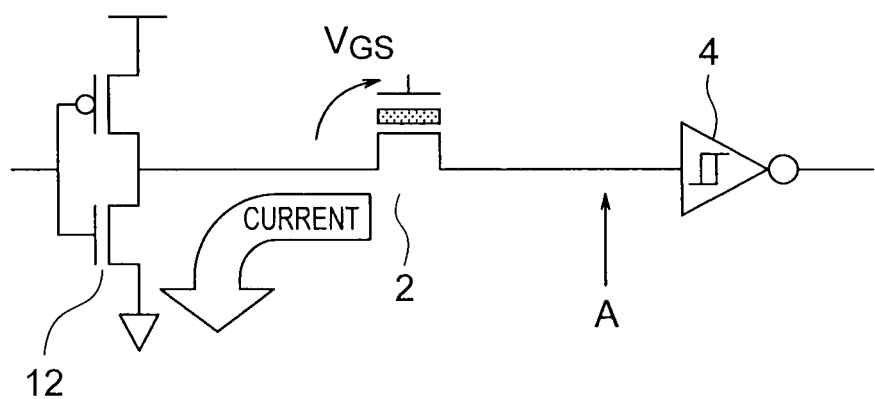
FIG. 16 is a diagram for explaining that an ascent speed of potential at an output end of an n-channel MOSFET type current noise source is slower than its descent speed.

It is supposed that the current noise source is an n-channel MOSFET type. The conductivity of the MOSFET is controlled mainly by a difference between a potential applied to its gate and its source potential. Here, the source potential is a lower potential in potentials at electrodes located at both ends of a channel of the n-channel MOSFET. FIG. 16 shows a relation between a gate-source voltage $V_{GS}$ and a current direction when the potential at the point A changes from "high" to "low." When the potential at the point A changes from "high" to "low," charges stored at the point A are discharged because a current flows through a path indicated by an arrow in FIG. 16. At this time, the source electrode of the current noise source 2 becomes the left side terminal in FIG. 16, and $V_{GS}$ is constant during the discharging. In other words, the conductivity of the current noise source 2 changes little.

Figure 17:
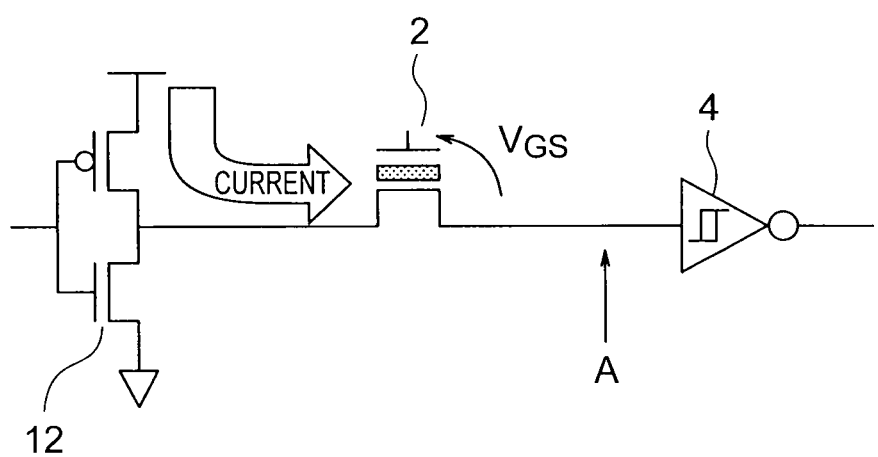
FIG. 17 is a diagram for explaining that an ascent speed of potential at an output end of an n-channel MOSFET type current noise source is slower than its descent speed.

On the other hand, FIG. 17 shows the case where the potential at the point A changes from "low" to "high."

In this case, a current flows in a direction indicated by an arrow in FIG. 17 and the point A is charged. At this time, the source electrode becomes the right side terminal in FIG. 17. As the current flows, the potential at the point A increases and $V_{GS}$ decreases. In other words, as the potential at the point A increases, the conductivity of the current noise source 2 becomes small gradually. It is appreciated from the foregoing description that the increase speed of the potential at the point A is slower than the decrease speed of the potential at the point A when the n-channel MOSFET type current noise source 2 is used.

If the current noise source 2 is the p-channel MOSFET type, the source potential which determines the conductivity is a higher potential at electrodes located at both ends of the channel. If the current noise sources of n-channel MOSFET type in FIGS. 16 and 17 are changed to p-channel MOSFET type, then the potential change speed at the point A is fast in potential increase and slow in potential decrease. If MOSFET type current noise sources are used as heretofore described, the potential increase speed and the potential decrease speed are asymmetrical to each other. In some cases, therefore, the duty ratio of the oscillator does not become 50%.

On the other hand, in the case of the resistance type current noise source, it is easy to set the duty ratio equal to 50% because the conductivity does not depend upon potentials applied to terminals. In some cases, however, the duty ratio does not become 50% depending upon matching of gate length and gate width between the n-channel MOSFET and p-channel MOSFET included in the inverter.

A specific example of the conversion circuit according to the present embodiment will now be described. The connection place between the conversion circuit and the ring oscillator differs according to the specific example.

In some cases, it is desirable to consider the duty ratio in determining where in the ring oscillator the conversion circuit should receive the input from.

Figure 18:
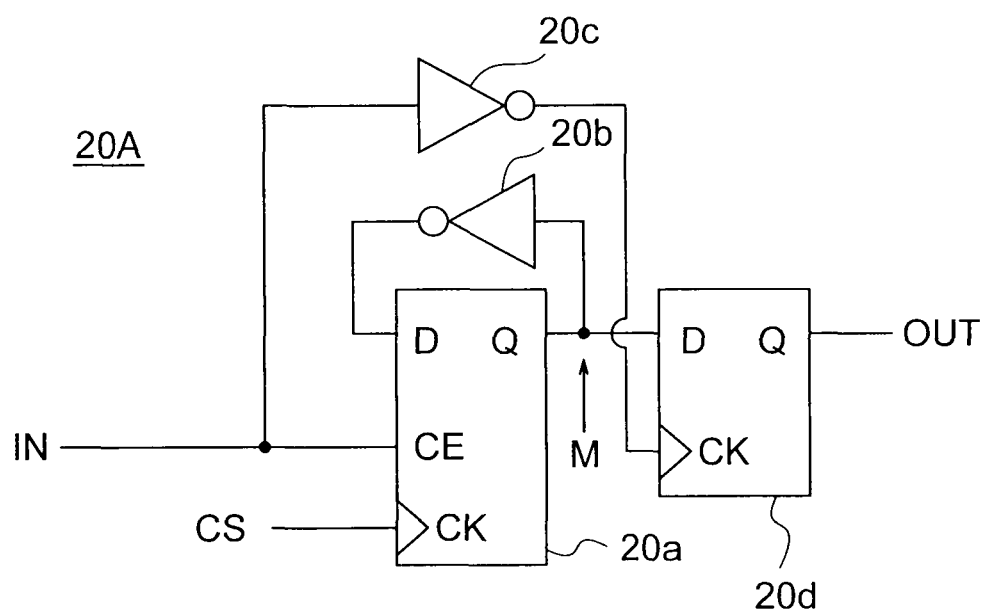
FIG. 18 is a circuit diagram showing a conversion circuit according to a first specific example.

A first specific example of the conversion circuit according to the present embodiment is shown in FIG. 18. A conversion circuit 20A in the first specific example includes a D-type flip-flop 20a, inverters 20b and 20c, and a D-type flip-flop 20d.

In general, the D-type flip-flop 20a has a feature that it has a CE terminal for controlling its operation. If a "high" level is input to the CE terminal, the flip-flop conducts its ordinary operation. If a "low" level is input to the CE terminal, the operation of the flip-flop is stopped. The operation of the flip-flop is based upon a signal input to a CK terminal (which is usually a clock signal), and data input to a D terminal is output from a Q terminal serving as an output terminal when a signal input to CK rises from "low" to "high".

In the present embodiment, an inverter 20b inverts the output Q of the D-type flip-flop 20a and feeds it back to the D terminal. A signal obtained by inverting an input signal IN by means of an inverter 20c is input to a CK terminal of the D-type flip-flop 20d. The D-type flip-flop 20d receives the output Q of the D-type flip-flop 20a at its D terminal. Data output from a Q terminal of the D-type flip-flop 20d becomes a random number.

Figure 19:
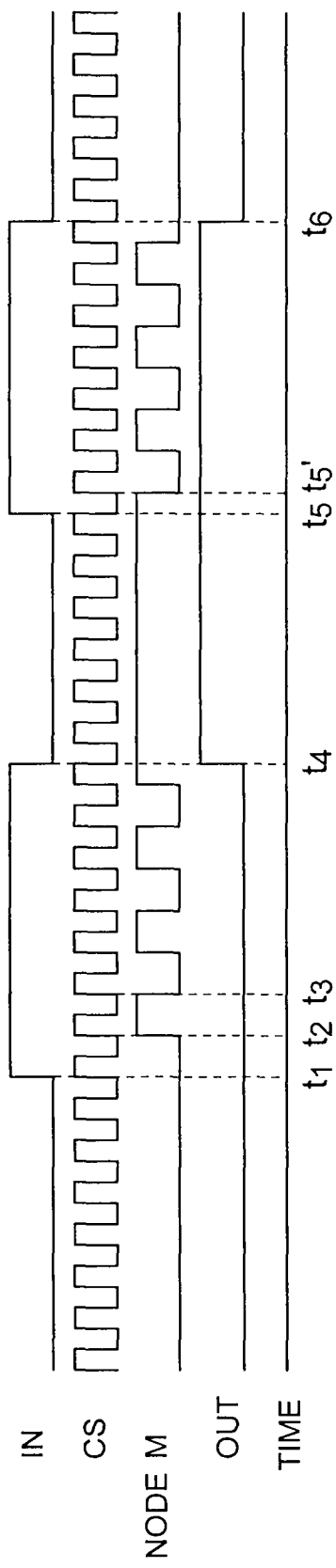
FIG. 19 is a timing chart showing operation of the conversion circuit according to the first specific example.

Operation of the conversion circuit 20A in the first specific example will now be described with reference to FIG. 19. Here, it is supposed that at first the input signal IN is in its "low" level state, a connection node M between the output terminal Q of the D-type flip-flop 20a and the D terminal of the D-type flip-flop 20d is at its "low" level and an output OUT is also its "low" level. This state continues until the input signal IN becomes its "high" level at time $t_1$. At this time, the D terminal of the flip-flop 20a is at its "high" level. If an oscillation signal CS becomes its "high" level at time $t_2$ (where $t_2 > t_1$), the node M connected to the output of the flip-flop 20a becomes its "high" level. At this time, the D terminal of the flip-flop 20a is made to be its "low" level by the inverter 20b.

Subsequently, if the oscillation signal CS is changed to its "high" level at time $t_3$ (where $t_3 > t_2$), the node M connected to the output of the flip-flop 20a becomes its "low" level. At this time, the D terminal of the flip-flop 20a is made to be its "high" level by the inverter 20b. This operation is repeated while the input signal IN is at its "high" level. In other words, while the input signal IN is at its "high" level, the potential level at the node M alternates between the "high" level and the "low" level repeatedly according to the oscillation of the oscillation signal CS.

If the potential at the node M is at its "high" level immediately before time $t_4$ (where $t_4 > t_3$) and the input signal IN changes from the "high" level to the "low" level at the time $t_4$, then the signal input to the CK terminal of the flip-flop 20d changes from the "low" level to the "high" level and consequently the potential level at the Q terminal of the flip-flop 20d, i.e., the output OUT changes from the "low" level to the "high" level. After the time $t_4$, however, the level of the input signal IN becomes "low" and consequently the potential level at the node M remains "high."

At time $t_5$ (where $t_5 > t_4$), the input signal IN is changed from the "low" level to the "high" level. In synchronism with a first rising edge of the oscillation signal CS after the input signal IN has changed to the "high" level, the potential level at the node M becomes "low" (at time $t_5'$). While the input signal IN is at its "high" level thereafter, the potential level at the node M alternates between the "high" level and the "low" level repeatedly according to the oscillation signal CS. During this time period, however, the potential level at the output OUT remains the "high" level.

If the potential at the node M is at its "low" level immediately before time $t_6$ (where $t_6 > t_5$) and the input signal IN changes from the "high" level to the "low" level at the time $t_6$, then the signal input to the CK terminal of the flip-flop 20d changes from the "low" level to the "high" level and consequently the potential level at the Q terminal of the flip-flop 20d, i.e., the output OUT changes from the "high" level to the "low" level. After the time $t_6$, however, the level of the input signal IN becomes "low" and consequently the potential level at the node M remains "low."

When the input signal IN is at the "high" level, the "high" level and the "low" level are output to the node M alternately according to the oscillation signal CS as appreciated from the foregoing description of the operation.

If the input signal IN decreases to the "low" level, the value at the node M is output to OUT. If the "high" level time period of the input signal IN varies at random, therefore, the potential level at the node M obtained immediately before the input signal IN changes from the "high" level to the "low" level becomes random. As a result, the output OUT becomes a random number. If the oscillation frequency of the oscillation signal CS varies at random, the potential level at the node M obtained immediately before the input signal IN changes from the "high" level to the "low" level becomes random. As a result, the output OUT becomes a random number.

When generating the random number by using the ring oscillator according to the present embodiment and the conversion number circuit 20A shown in FIG. 18, there are two methods according to which of the CE terminal and the CK terminal of the flip-flop 20a in the conversion circuit 20A receives the output of the ring oscillator. In one method, the output of the ring oscillator is input to the CE terminal of the flip-flop 20a and the external oscillation signal is input to the CK terminal. In the other method, the external oscillation signal is input to the CE terminal and the output of the ring oscillator is input to the CK terminal. As regards the two methods, features and matters to be attended to in circuit configuration will now be described.

Figure 20:
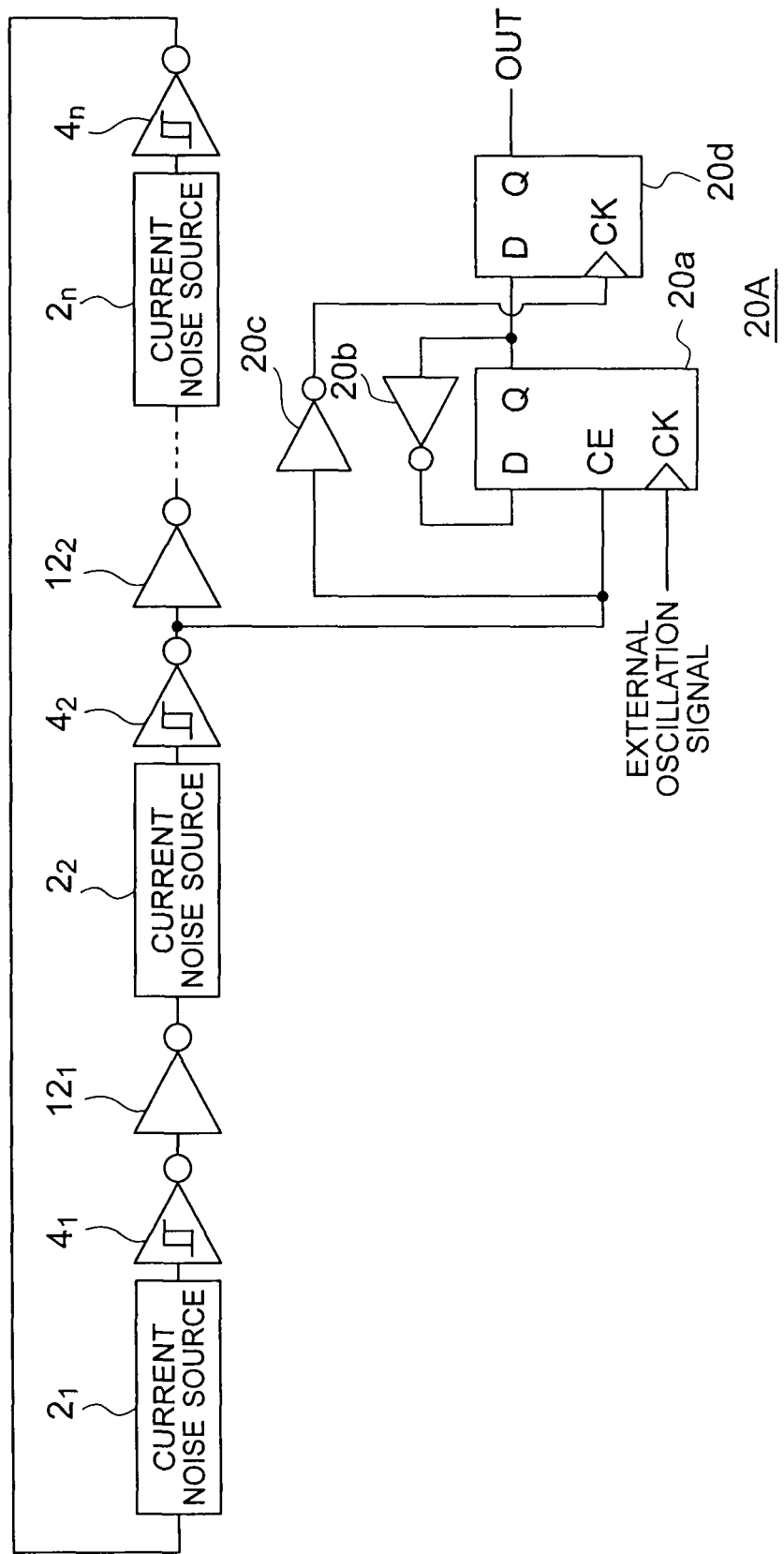
FIG. 20 is a circuit diagram showing a random number generation device according to an embodiment using the conversion circuit of the first specific example.

FIG. 20 shows a circuit in which the output of the ring oscillator shown in FIG. 15 is input to the CE terminal and the external oscillation signal is input to the CK terminal. This circuit configuration has a feature that the random number generation speed is fast because the random number can be generated at the oscillation frequency of the ring oscillator. This circuit configuration is effective when an external oscillation signal which is sufficiently fast as compared with the oscillation frequency of the ring oscillator can be prepared. If the duty ratio of the ring oscillator is not 50%, it is desirable to input a signal having a "high" level time period longer than a "low" level time period to the CE terminal. This is because fluctuation at a level having a longer output time is larger than fluctuation at a level having a shorter output time.

Figure 21:
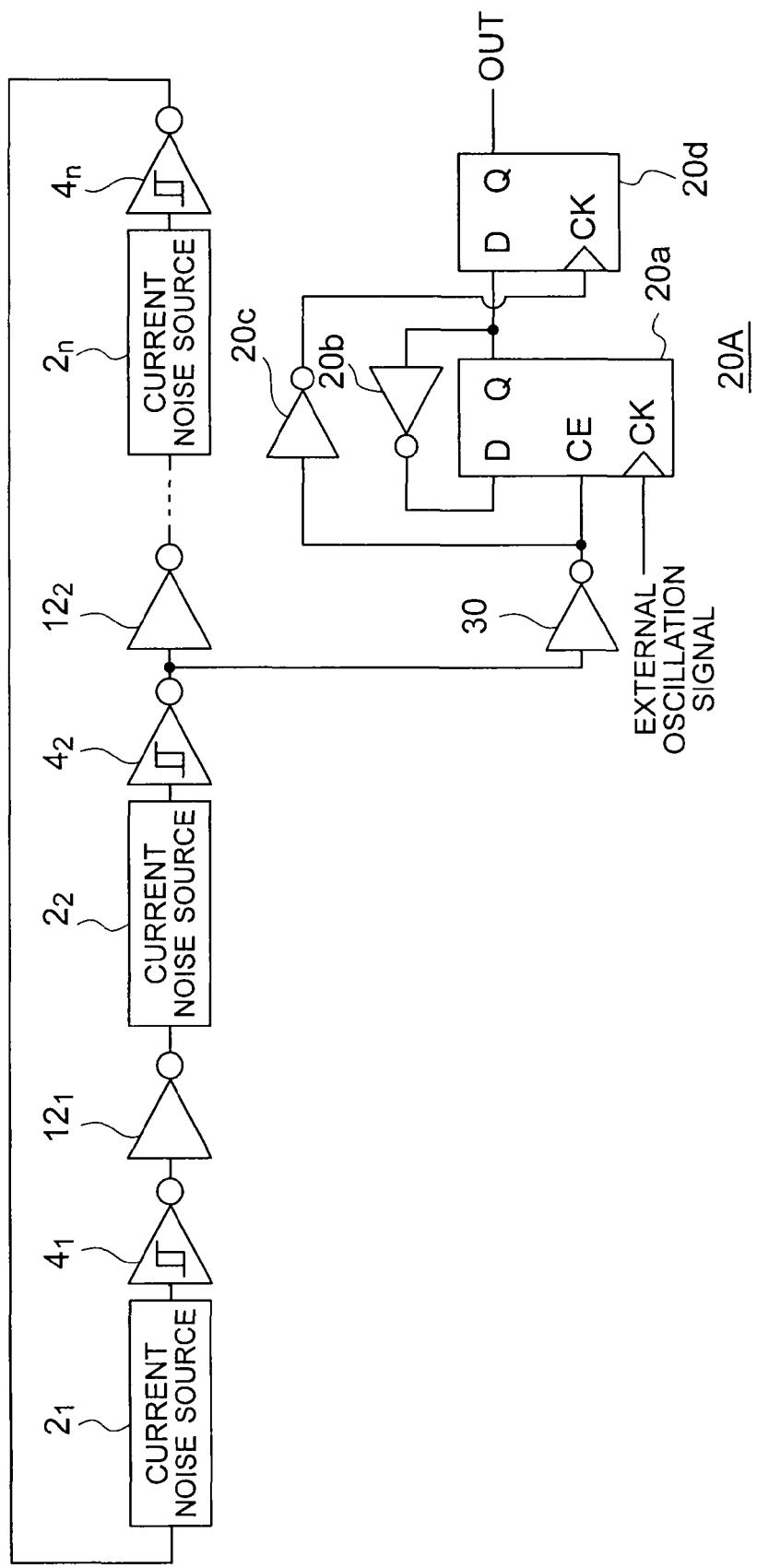
FIG. 21 is a circuit diagram showing a random number generation device according to an embodiment using the conversion circuit of the first specific example.

If a signal having a "high" level time period longer than a "low" level time period cannot be obtained due to the layout or the like, an inverter 30 is placed immediately before the CE terminal of the flip-flop 20a as shown in FIG. 21. By doing so, a signal having a "high" level time period longer than a "low" level time period can be input to the conversion circuit 20A.

Figure 22:
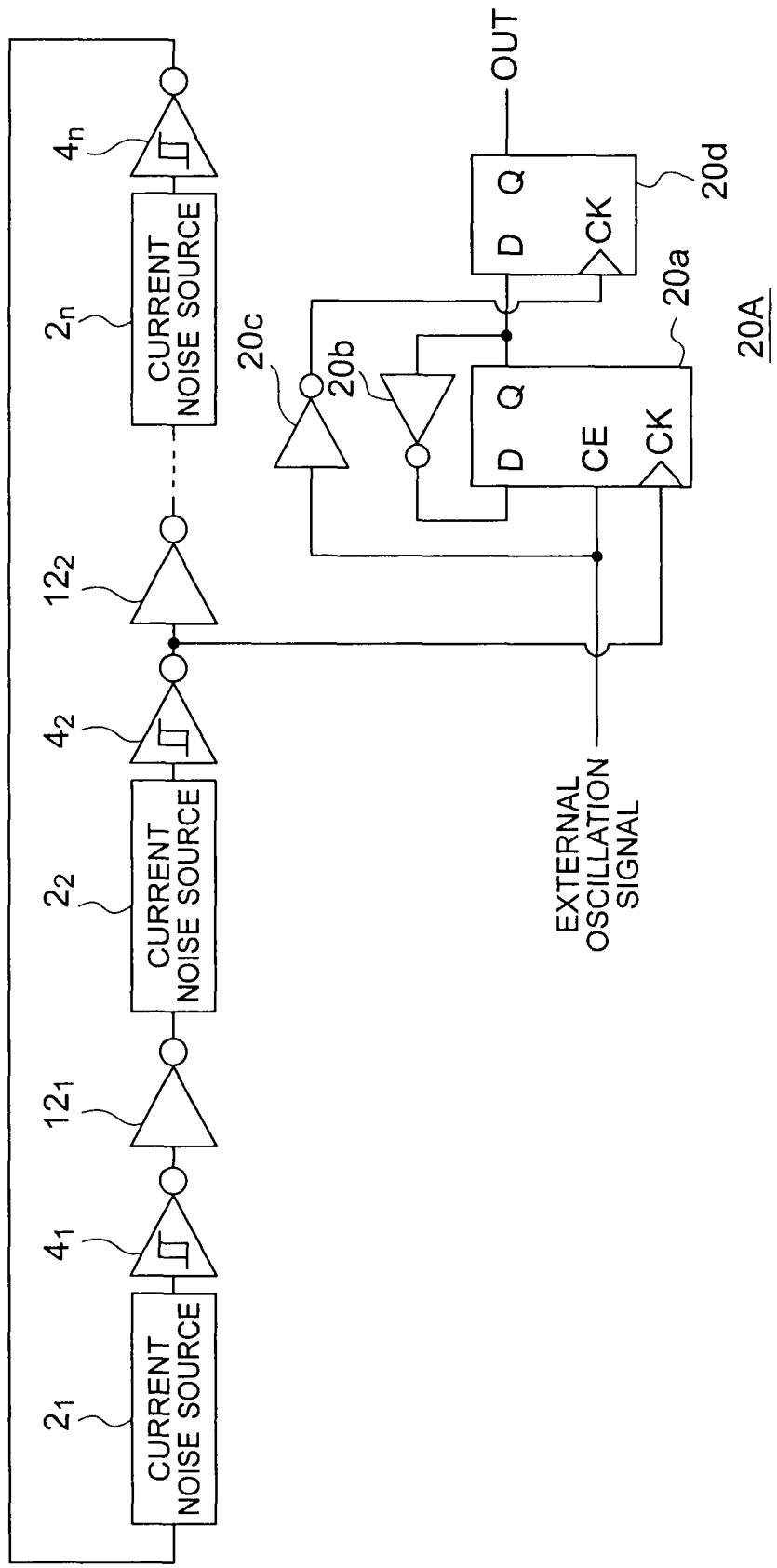
FIG. 22 is a circuit diagram showing a random number generation device according to an embodiment using the conversion circuit of the first specific example.

FIG. 22 shows a random number generation device in which the external oscillation signal is input to the CE terminal of the flip-flop 20a and the output of the ring oscillator shown in FIG. 15 is input to the CK terminal. In this case, it is necessary that the external oscillation signal is smaller in oscillation frequency than the output of the oscillator. This circuit configuration is effective in the case where the oscillation frequency of the oscillator is sufficiently faster than the needed random number generation rate. This circuit configuration is also effective in the case where there is a concern that a fast external oscillation signal becomes a noise source of another circuit. In the circuit configuration shown in FIG. 22, any of the outputs of the ring oscillator may be input unlike the configuration shown in FIG. 21. This is because the conversion circuit 20A shown in FIG. 18 counts the number of times of oscillation in the signal input to the CK terminal and its duty ratio does not affect the operation. As for the external oscillation signal, it is also effective to produce an oscillation signal in which the duty ratio is not 50% and the high level time period is longer than the low level time period. This is because the randomness can be enhanced by causing the ring oscillator to oscillate for a longer time.

Power dissipation in the case where the ring oscillator shown in FIG. 9 is used as the ring oscillator in the random number generation device shown in FIG. 20 is compared with power dissipation in the random number generation device described in JP-A 2006-189946 (KOKAI) by conducting simulation. As for the transistor model for simulation, the predictive technology model is used (see URL: http://www.eas.asu.edu/~ptm/, and Y. Cao, T. Sato, D. Sylvester, M. Orshansky, C. Hu, "New paradigm of predictive MOSFET and interconnect modeling for early circuit design," pp. 201-204, CICC, 2000).

As a result of power dissipation calculation, the power dissipation is 0.87 mW for the random number generation device described in JP-A 2006-189946 (KOKAI) and 0.74 mW for the random number generation device according to the present embodiment. Thus, improvement in power dissipation is indicated.

Figure 23:
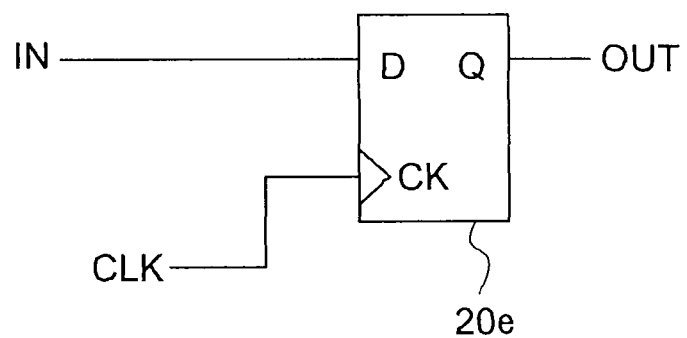
FIG. 23 is a circuit diagram showing a conversion circuit according to a second specific example.

A second specific example of a conversion circuit according to the present embodiment is shown in FIG. 23. A conversion circuit 20B in the second specific example includes a D-type flip-flop 20e. An oscillation signal input to a D terminal of the flip-flop 20e is output from a Q terminal as output OUT in response to a rising edge of a clock signal CLK input to a CK terminal. It is necessary that the signal IN input to a D terminal is larger in frequency than the signal CLK input to the CK terminal. There are two ways in the method for generating a random number by using the conversion circuit 20B shown in FIG. 23 and the ring oscillator according to the present embodiment. In one method, the external oscillation signal is input to the D terminal and the output of the ring oscillator is input to the CK terminal. In the other method, the output of the ring oscillator is input to the D terminal and the external oscillation signal is input to the CK terminal.

Figure 24:
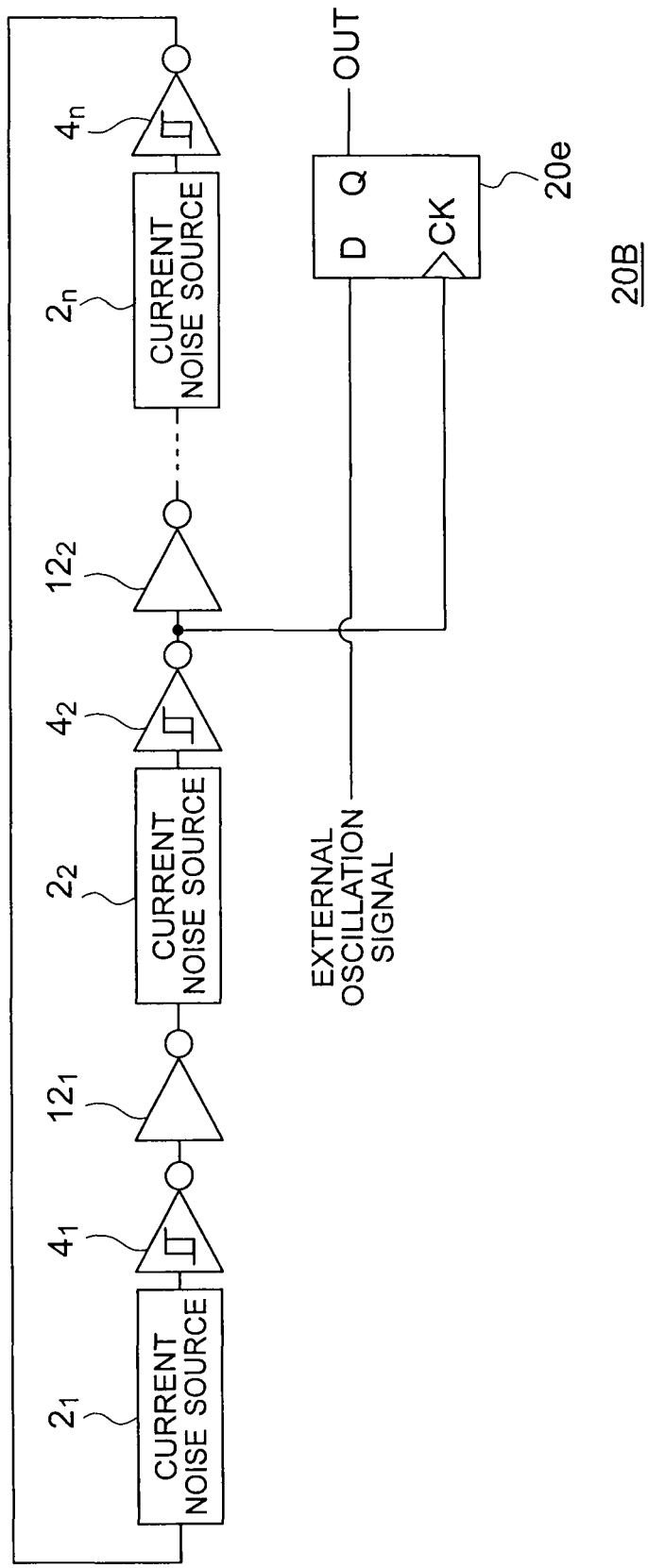
FIG. 24 is a circuit diagram showing a random number generation device according to an embodiment using the conversion circuit of the second specific example.

FIG. 24 shows a random number generation device in which the external oscillation signal is input to the D terminal of the conversion circuit 20B shown in FIG. 23 and the output of the ring oscillator shown in FIG. 15 is input to the CK terminal. In this circuit configuration, it is desirable that the duty ratio of the external oscillation signal is 50%. Furthermore, the input to the CK terminal may be taken out from any place in the ring oscillator.

This circuit configuration has a feature that the random number generation speed is fast because the random number can be generated at the oscillation frequency of the oscillator.

Figure 25:
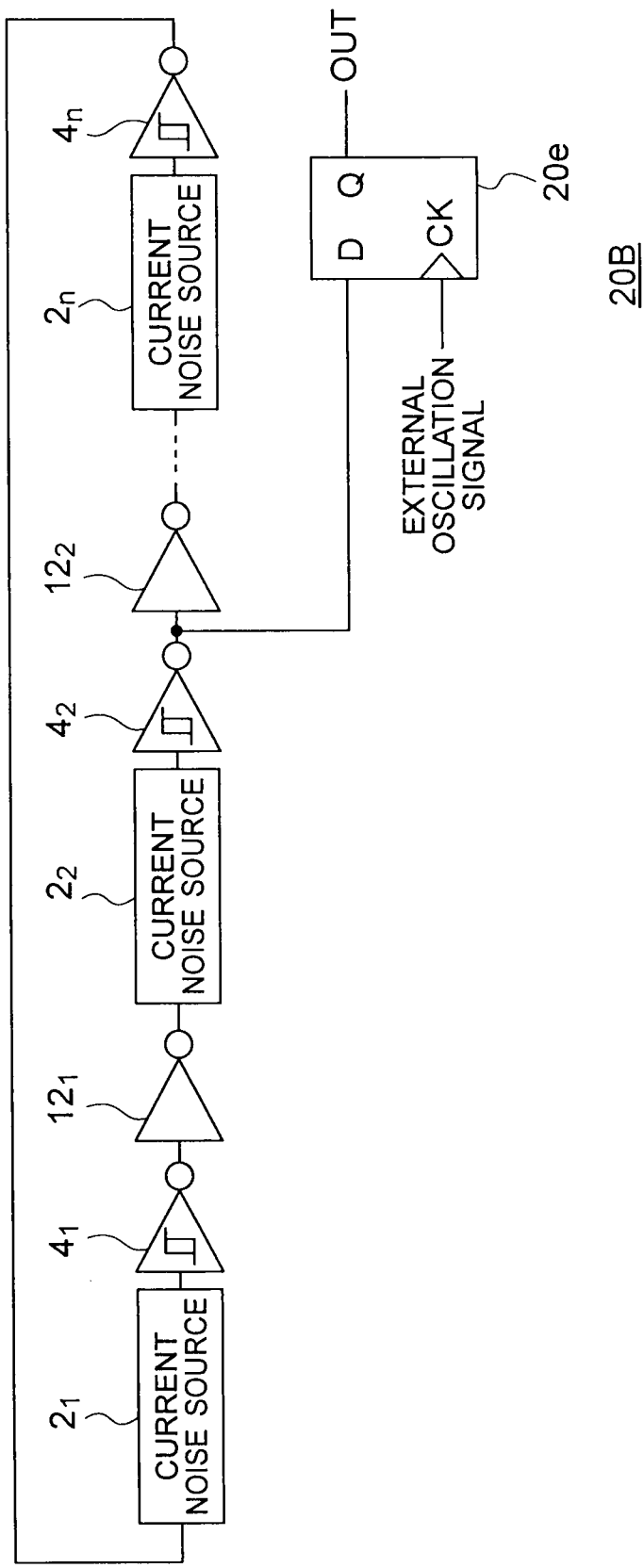
FIG. 25 is a circuit diagram showing a random number generation device according to an embodiment using the conversion circuit of the second specific example.
Figure 26:
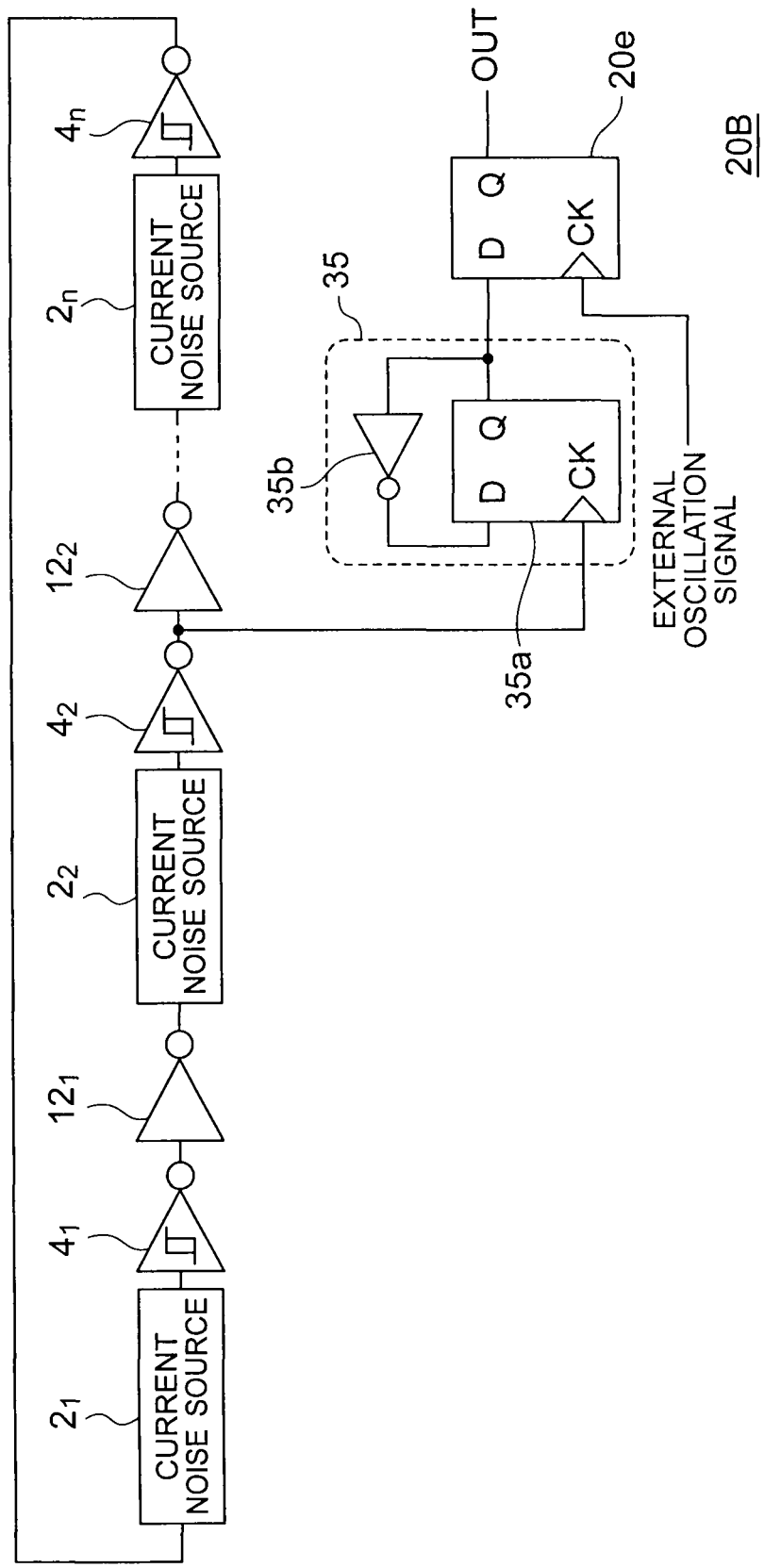
FIG. 26 is a circuit diagram showing a random number generation device according to an embodiment using the conversion circuit of the second specific example.

FIG. 25 shows a random number generation device in which the output of the ring oscillator shown in FIG. 15 is input to the D terminal of the conversion circuit 20B shown in FIG. 23B and the external oscillation signal is input to the CK terminal. In this circuit configuration, it is desirable that the oscillator has a duty ratio of 50%. If the duty ratio is not 50%, then a frequency divider 35 should be provided between the output of the ring oscillator and the conversion circuit 20B as shown in FIG. 26. This frequency divider 35 includes a D-type flip-flop 35a which receives the output of the ring oscillator at its CK terminal, and an inverter 35b which feeds back an inverted signal for an output of a Q terminal of the flip-flop 35a to its D terminal. Therefore, the frequency divider 35 becomes a ½ frequency divider.

Although the ½ frequency divider is used in FIG. 26, the frequency division ratio may have any value such as ¼, ⅛ or 1/16. In this circuit configuration, it is necessary that the external oscillation signal is slower than the oscillation frequency of the ring oscillator. This circuit configuration is effective when the oscillation frequency of the oscillator is sufficiently faster than the needed random number generation speed or when a fast external oscillation signal cannot be used.

As for the random number generation device according to the present embodiment, all of the current noise source, the ring oscillator and the conversion circuit can be generated by using the standard semiconductor integrated circuit manufacturing process. Therefore, it is easy to integrate them on a semiconductor substrate.

A difference of the random number generation device according to the present embodiment from other known random number generation devices will now be described.

A random number generation device with a circuit for changing the oscillation period added to the oscillator is disclosed in JP-A 2001-166920 (KOKAI). In the random number generation device described in JP-A 2001-166920 (KOKAI), a circuit for changing the oscillation frequency is added to a ring oscillator formed of inverters.

As already described in description as to the course of events for achieving the present invention, the width of the input required to invert the output of the inverter is narrow. In the random number generation device described in JP-A 2001-166920 (KOKAI) as well, therefore, discussion similar to that as to how the present invention is made holds true and the change of the oscillation frequency is small. Therefore, it is difficult to output a random number of good quality.

On the other hand, owing to the configuration of the present embodiment in which Schmitt inverters each receiving an output of a current noise source are incorporated into the ring oscillator, it becomes possible to make the fluctuation of the oscillation frequency and a random number of good quality can be generated.

A random number generation device using a ring oscillator and a Schmitt trigger is disclosed in JP-A 2003-108365 (KOKAI). In the random number generation device described in JP-A 2003-108365 (KOKAI), an output of an oscillator is input to a CR integrator serving as a noise source and jitter is applied to the oscillation signal by the effect of thermal noise of the CR integrator. And a random number is generated by utilizing the jitter. In the configuration, the Schmitt trigger and the CR integrator are disposed outside the oscillator. The Schmitt trigger has an effect serving as a buffer which prevents the circuit from conducting false operation due to voltage noise. This effect is generally known as the use object of the Schmitt trigger. Since the noise source is disposed outside the oscillator, the effect of noise is thrown away in each period and the effect of the noise is not preserved in the oscillation signal. In other words, entropy generated by noise is not accumulated.

On the other hand, in the present embodiment, Schmitt inverters each receiving an output of a current noise source are incorporated into the ring oscillator. This configuration has an effect of increasing charges which flow to the current noise source and effectively exerting influence upon the oscillation waveform. In addition, entropy generated by the current noise source can be accumulated each time oscillation is caused. The random number generation device according to the present embodiment differs from the random number generation device disclosed in JP-A 2003-108365 (KOKAI) in configuration, object and effect. In the most general use of the Schmitt trigger, the Schmitt trigger is used to prevent a circuit from conducting false operation due to voltage noise.

On the other hand, in the present embodiment, logic gates which are generally used to remove noise are used for the new object of effectively exerting influence of noise upon the oscillation signal.

According to an embodiment of the present invention, it is possible to provide a random number generation device which generates a physical random number with as little power dissipation as possible as heretofore described.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A random number generation device comprising:
a ring oscillator having at least one set of components, each set of components comprising a current noise source, a Schmitt inverter configured to receive an output of the current noise source, and at least two inverters which are connected in series to the output of the Schmitt inverter, wherein an output of a last inverter of the at least two inverters is input to the current noise source, the current noise source being an n-channel MOSFET type current noise source including a source electrode, a drain electrode, and a gate electrode, current flowing between the source electrode and the drain electrode fluctuating when constant voltages are applied to the source electrode, the drain electrode, and the gate electrode respectively; and
a conversion circuit configured to convert an output of the Schmitt inverter to a random number and output the random number.

2. The device according to claim 1, wherein the Schmitt inverter has a first threshold voltage $V_H$ and a second threshold voltage $V_L$ smaller than the first threshold voltage $V_H$, and the first threshold voltage $V_H$ and the second threshold voltage $V_L$ satisfy the following relation expression, $$\frac{\Delta t1}{T+t1} = \frac{\frac{C}{\sigma}\left(\frac{\Delta\sigma}{\sigma}\right)\ln\left(\frac{VDD-V_L}{VDD-V_H}\right)}{T+\frac{C}{\sigma}\ln\left(\frac{VDD-V_L}{VDD-V_H}\right)} \geq 0.01$$

where C is input gate capacitance of the Schmitt inverter, a is an electrical conductivity of the current noise source, $\Delta\sigma$ is fluctuation of the electrical conductivity a of the current noise source, VDD is a power supply voltage, T is an accumulation value of gate delays of a part of the ring oscillator excluding the Schmitt inverter, t1 is a delay time taken for a gate voltage of the Schmitt inverter to change from the second threshold voltage $V_L$ to the first threshold voltage $V_H$, and $\Delta t1$ is a fluctuation time of the delay time t1 obtained when the electrical conductivity σ of the current noise source fluctuates by $\Delta\sigma$.

3. The device according to claim 1, wherein
a voltage VG applied to a gate of the n-channel MOSFET type current noise source is given so as to satisfy $VG > V_H + Vth$ where $V_H$ is a threshold voltage of the Schmitt inverter that output voltage of the Schmitt inverter changes from high-level to low-level when input voltage of the Schmitt inverter exceeds $V_H$, and Vth is a threshold of the n-channel MOSFET type current noise source.

4. A random number generation device comprising:
a ring oscillator having at least one set of components, each set of components comprising a current noise source, a Schmitt inverter configured to receive an output of the current noise source, and at least two inverters which are connected in series to the output of the Schmitt inverter, wherein an output of a last inverter of the at least two inverters is input to the current noise source, the current noise source being an p-channel MOSFET type current noise source including a source electrode, a drain electrode, and a gate electrode, current flowing between the source electrode and the drain electrode fluctuating when constant voltages are applied to the source electrode, the drain electrode, and the gate electrode respectively; and
a conversion circuit configured to convert an output of the Schmitt inverter to a random number and output the random number.

5. The device according to claim 1, wherein the conversion number circuit comprises a D-type flip-flop having a D terminal to receive an output of the ring oscillator, a CK terminal to receive an external oscillation signal, and a Q terminal to output the random number.

6. The device according to claim 1, wherein the Schmitt inverter comprises:
an input terminal;
an output terminal;
a first p-channel MOSFET having a gate connected to the input terminal and having a source connected to a drive power supply;
a second p-channel MOSFET having a gate connected to the input terminal, having a source connected to a drain of the first p-channel MOSFET, and having a drain connected to the output terminal;
a first n-channel MOSFET having a gate connected to the input terminal and having a drain connected to the drain of the second p-channel MOSFET;
a second n-channel MOSFET having a gate connected to the input terminal, having a drain connected to a source of the first n-channel MOSFET, and having a source connected to ground;
a third p-channel MOSFET having a source connected to the drain of the first p-channel MOSFET, having a drain connected to the ground, and having a gate connected to the output terminal; and
a third n-channel MOSFET having a source connected to the source of the first n-channel MOSFET, having a drain connected to the drive power supply, and having a gate connected to the output terminal.

7. The device according to claim 1, wherein the ring oscillator is a series circuit obtained by serially connecting an odd number of sets each comprising the current noise source and the Schmitt inverter.

8. The device according to claim 1,
a sum of the number of the Schmitt inverters and the number of the inverters is an odd number.

9. The device according to claim 4, wherein
a voltage VG applied to a gate of the p-channel MOSFET type current noise source is given so as to satisfy $$VG < V_L - Vth$$

where $V_L$ is a threshold voltage of the Schmitt inverter that output voltage of the Schmitt inverter changes from low-level to high-level when input voltage of the Schmitt inverter lowers $V_L$, and Vth is an absolute value of a threshold of the p-channel MOSFET type current noise source.

10. The device according to claim 4, wherein
the Schmitt inverter has a first threshold voltage VH and a second threshold voltage VL smaller than the first threshold voltage VH, and
the first threshold voltage VH and the second threshold voltage VL satisfy the following relation expression, $$\frac{\Delta t1}{T+t1} = \frac{\frac{C}{\sigma}\left(\frac{\Delta\sigma}{\sigma}\right)\ln\left(\frac{VDD-V_L}{VDD-V_H}\right)}{T+\frac{C}{\sigma}\ln\left(\frac{VDD-V_L}{VDD-V_H}\right)} \geq 0.01$$

where C is input gate capacitance of the Schmitt inverter, r is an electrical conductivity of the current noise source, $\Delta\sigma$ is fluctuation of the electrical conductivity $\sigma$ of the current noise source, VDD is a power supply voltage, T is an accumulation value of gate delays of a part of the ring oscillator excluding the Schmitt inverter, t1 is a delay time taken for a gate voltage of the Schmitt inverter to change from the second threshold voltage VL to the first threshold voltage VH, and $\Delta t1$ is a fluctuation time of the delay time t1 obtained when the electrical conductivity $\sigma$ of the current noise source fluctuates by $\Delta\sigma$.

11. The device according to claim 4, wherein the conversion number circuit comprises a D-type flip-flop having a D terminal to receive an output of the ring oscillator, a CK terminal to receive an external oscillation signal, and a Q terminal to output the random number.

12. The device according to claim 4, wherein the Schmitt inverter comprises:
an input terminal;
an output terminal;
a first p-channel MOSFET having a gate connected to the input terminal and having a source connected to a drive power supply;
a second p-channel MOSFET having a gate connected to the input terminal, having a source connected to a drain of the first p-channel MOSFET, and having a drain connected to the output terminal;
a first n-channel MOSFET having a gate connected to the input terminal and having a drain connected to the drain of the second p-channel MOSFET;
a second n-channel MOSFET having a gate connected to the input terminal, having a drain connected to a source of the first n-channel MOSFET, and having a source connected to ground;
a third p-channel MOSFET having a source connected to the drain of the first p-channel MOSFET, having a drain connected to the ground, and having a gate connected to the output terminal; and
a third n-channel MOSFET having a source connected to the source of the first n-channel MOSFET, having a drain connected to the drive power supply, and having a gate connected to the output terminal.

13. The device according to claim 4, wherein the ring oscillator is a series circuit obtained by serially connecting an odd number of sets each comprising the current noise source and the Schmitt inverter.

14. The device according to claim 4, wherein a sum of the number of the Schmitt inverters and the number of the inverters is an odd number.

\* \* \* \* \*